(12) United States Patent
Das et al.

(10) Patent No.: US 10,079,224 B2
(45) Date of Patent: Sep. 18, 2018

(54) INTERCONNECT STRUCTURES FOR ASSEMBLY OF SEMICONDUCTOR STRUCTURES INCLUDING AT LEAST ONE INTEGRATED CIRCUIT STRUCTURE

(71) Applicant: Massachusetts Institute of Technology, Cambridge, MA (US)

(72) Inventors: Rabindra N. Das, Lexington, MA (US); Donna-Ruth W. Yost, Acton, MA (US); Chenson Chen, Waban, MA (US); Keith Warner, Whitinsville, MA (US); Steven A. Vitale, Waltham, MA (US); Mark A. Gouker, Belmont, MA (US); Craig L. Keast, Groton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/327,249

(22) PCT Filed: Aug. 11, 2015

(86) PCT No.: PCT/US2015/044651
§ 371 (c)(1),
(2) Date: Jan. 18, 2017

(87) PCT Pub. No.: WO2016/025478
PCT Pub. Date: Feb. 18, 2016

(65) Prior Publication Data
US 2017/0162550 A1 Jun. 8, 2017

Related U.S. Application Data

(60) Provisional application No. 62/035,713, filed on Aug. 11, 2014.

(51) Int. Cl.
*H01L 25/10* (2006.01)
*H01L 23/00* (2006.01)
(Continued)

(52) U.S. Cl.
CPC ...... *H01L 25/105* (2013.01); *H01L 23/49822* (2013.01); *H01L 23/49827* (2013.01);
(Continued)

(58) Field of Classification Search
CPC . H01L 25/105; H01L 25/50; H01L 23/49822; H01L 23/49827;
(Continued)

(56) References Cited

U.S. PATENT DOCUMENTS 4,316,200 A 2/1982 Ames et al.
4,612,083 A 9/1986 Yasumoto et al.
(Continued)

FOREIGN PATENT DOCUMENTS

WO WO 2016/025451 A1 2/2016
WO WO 2016/073049 A1 5/2016
WO WO 2017/015432 A1 1/2017

OTHER PUBLICATIONS

Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
(Continued)

*Primary Examiner* — Cuong Q Nguyen
*Assistant Examiner* — Tong-Ho Kim
(74) *Attorney, Agent, or Firm* — Daly, Crowly, Mofford & Durkee, LLP

(57) ABSTRACT

A semiconductor structure includes at least two substrate layers, each of the at least two substrate layers having first and second opposing surfaces and a plurality of electrical
(Continued)

connections extending between the first and second surfaces. The semiconductor structure also includes a substrate joining layer disposed between and coupled to the second surface of a first one of the at least two substrate layers and the first surface of a second one of the at least two substrate layers. The substrate joining layer includes at least one integrated circuit (IC) structure disposed between the first and second surfaces of said substrate joining layer. A corresponding method for fabricating a semiconductor structure is also provided.

16 Claims, 14 Drawing Sheets

(51) Int. Cl.
*H01L 23/498* (2006.01)
*H01L 25/00* (2006.01)

(52) U.S. Cl.
CPC ........ *H01L 23/49838* (2013.01); *H01L 24/16* (2013.01); *H01L 25/50* (2013.01); *H01L 2224/16227* (2013.01); *H01L 2225/1023* (2013.01); *H01L 2225/1058* (2013.01); *H01L 2225/1082* (2013.01); *H01L 2225/1094* (2013.01)

(58) Field of Classification Search
CPC ............... H01L 23/49838; H01L 24/16; H01L 2224/16227; H01L 2225/1023; H01L 2225/1058; H01L 2225/1082; H01L 2225/1094
USPC ................... 257/686, 773; 361/728; 438/106
See application file for complete search history.

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,179,070 A | 1/1993 | Harada et al. | |
| 5,371,328 A | 12/1994 | Gutierrez et al. | |
| 5,650,353 A | 7/1997 | Yoshizawa et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,346,469 B1 | 2/2002 | Greer | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,678,167 B1 | 1/2004 | Degani et al. | |
| 6,819,000 B2* | 11/2004 | Magerlein ............... H05K 1/112 257/678 | |
| 6,825,534 B2 | 11/2004 | Chen et al. | |
| 6,838,774 B2* | 1/2005 | Patti .................. H01L 21/76898 257/737 | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 7,993,971 B2 | 8/2011 | Chatterjee et al. | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2* | 7/2013 | Bachman ............ H01L 23/3677 257/675 | |
| 8,519,543 B1* | 8/2013 | Song ...................... H01L 24/17 257/700 | |
| 8,546,188 B2 | 10/2013 | Liu et al. | |
| 8,564,955 B2* | 10/2013 | Schmidt ................ H01L 23/367 165/104.33 | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 | 10/2015 | Sun et al. | |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2006/0191640 A1 | 8/2006 | Johnson | |
| 2007/0087544 A1 | 4/2007 | Chang et al. | |
| 2007/0119812 A1 | 5/2007 | Kerdiles et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2008/0316714 A1* | 12/2008 | Eichelberger ....... H01L 21/6835 361/728 |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0026447 A1 | 2/2010 | Keefe et al. | |
| 2010/0122762 A1 | 5/2010 | George | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0032340 A1 | 2/2012 | Choi et al. | |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |
| 2014/0001604 A1 | 1/2014 | Sadaka | |
| 2014/0065771 A1 | 3/2014 | Gruber et al. | |
| 2014/0113828 A1 | 4/2014 | Gilbert et al. | |
| 2014/0246763 A1 | 9/2014 | Bunyk | |
| 2014/0264890 A1 | 9/2014 | Breuer et al. | |
| 2015/0041977 A1 | 2/2015 | Daubenspeck et al. | |
| 2015/0054151 A1 | 2/2015 | Choi et al. | |
| 2015/0054167 A1 | 2/2015 | Pendse | |
| 2015/0054175 A1 | 2/2015 | Meinhold et al. | |
| 2016/0364653 A1 | 12/2016 | Chow et al. | |

OTHER PUBLICATIONS

Tarniowy, et al.; "The Effect of Thermal Treatment on the Structure, Optical and Electrical Properties of Amorphous Titanium Nitride Thin Films;" Thin Solid Films 311; 1997; 8 pages.

PCT Search Report of the ISA for PCT/US2016/052824 dated Feb. 3, 2017; 6 pages.

PCT Written Opinion of the ISA for PCT/US2016/052824 dated Feb. 3, 2017; 6 pages.

PCT Search Report of the ISA for PCT/US2016/043266 dated Dec. 5, 2016; 5 pages.

(56) References Cited

OTHER PUBLICATIONS

PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
PCT International Preliminary Report on Patentability dated May 18, 2017 for PCT App. No. PCT/US2015/059181; 11 pages.
PCT International Preliminary Report on Patentability dated May 18, 2017 for PCT Appl. No. PCT/US2015/059200; 11 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated Jun. 8, 2017 for U.S. Appl. No. 15/271,755, filed Jun. 19, 2017; 1 page.
Office Action dated Aug. 11, 2017 for U.S. Appl. No. 15/342,444; 22 pages.
U.S. Appl. No. 15/303,800, filed Oct. 13, 2016, Das, et al.
U.S. Appl. No. 15/312,063, filed Nov. 17, 2016, Das, et al.
U.S. Appl. No. 14/694,540, filed Apr. 23, 2015, Das, et al.
U.S. Appl. No. 15/271,755, filed Sep. 21, 2016, Das.
U.S. Appl. No. 15/342,478, filed Nov. 3, 2016, Oliver, et al.
U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Final Office Action dated Dec. 6, 2017 for U.S. Appl. No. 15/342,444; 18 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
U.S. Appl. No. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517, filed Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Response to Aug. 11, 2017 Office Action for U.S. Appl. No. 15/342,444, filed Sep. 15, 2017; 20 pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Final Office Action dated Dec. 20, 2017 for U.S. Appl. No. 15/271,755; Response filed Apr. 23, 2018; 23 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.

(56) References Cited

OTHER PUBLICATIONS

PCT International Preliminary Report dated May 17, 2018 for International Application No. PCT/US2016/060309; 8 Pages.

* cited by examiner

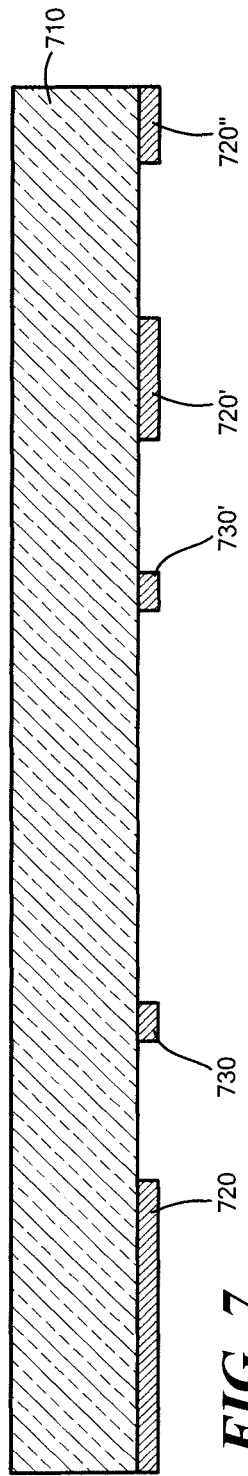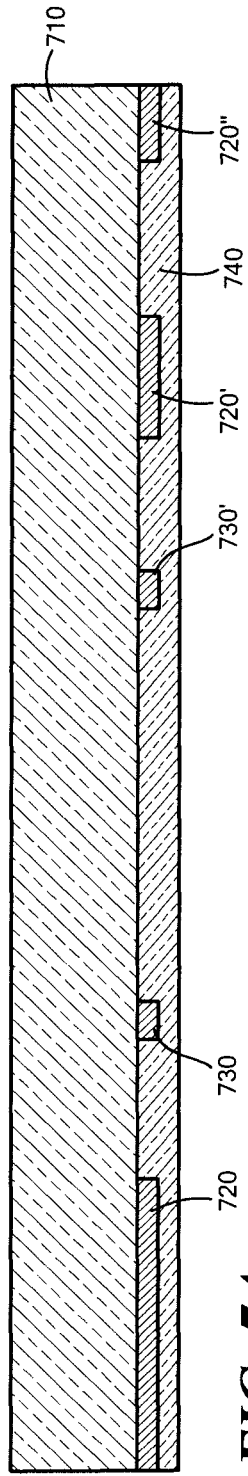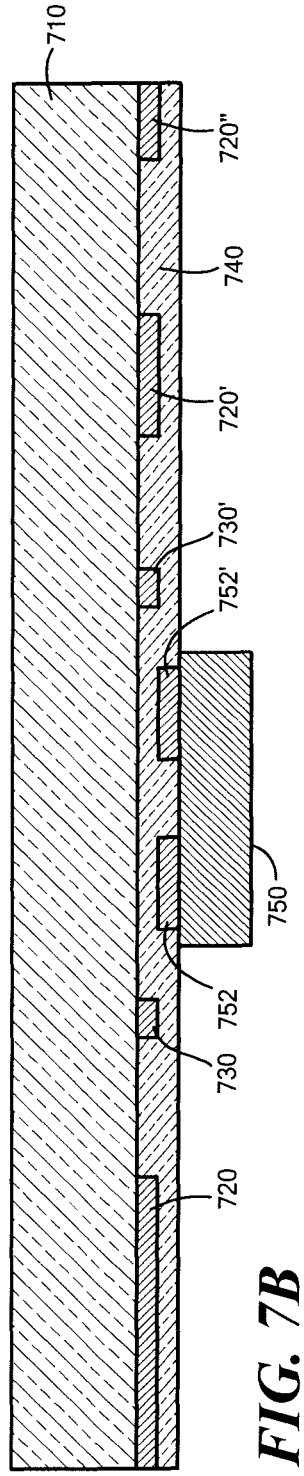

INTERCONNECT STRUCTURES FOR ASSEMBLY OF SEMICONDUCTOR STRUCTURES INCLUDING AT LEAST ONE INTEGRATED CIRCUIT STRUCTURE

CROSS REFERENCE TO RELATED APPLICATIONS

This application is a U.S. National Stage of PCT application PCT/US2015/044651 filed in the English language on Aug. 11, 2015, and entitled "INTERCONNECT STRUCTURES FOR ASSEMBLY OF SEMICONDUCTOR STRUCTURES INCLUDING AT LEAST ONE INTEGRATED CIRCUIT STRUCTURE," which claims the benefit under 35 U.S.C. § 119 of provisional application No. 62/035,713 filed Aug. 11, 2014, which application is hereby incorporated herein by reference.

STATEMENT REGARDING FEDERALLY SPONSORED RESEARCH

This invention was made with government support under Contract No. FA8721-05-C-0002 awarded by the U.S. Air Force. The government has certain rights in the invention.

FIELD

This disclosure relates generally to semiconductor structures, and more particularly, to semiconductor interconnect structures which enable assembly of semiconductor structures including at least one integrated circuit structure.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, for example, drives a need for multi-layer integrated semiconductor (IC) structures (e.g., three dimensional (3D) integrated circuits (ICs)), semiconductor structures in which a number of individual semiconductor structures are both mechanically and electrically coupled. The foregoing trend and demand also drives a need for interconnect structures which enable assembly of semiconductor structures including at least one integrated circuit structure (e.g., multi-layer IC structure).

SUMMARY

Described herein are concepts, systems, circuits and techniques related to a semiconductor interconnect structure (i.e., a substrate joining layer) suitable for electrically and mechanically coupling at least two semiconductor structures (e.g., substrate layers) together to form a semiconductor structure including the at least two semiconductor structures. The present disclosure further describes circuits and techniques for fabricating semiconductor structures including at least one integrated circuit structure (e.g., 2D, 2.5D, and 3D IC structures), the at least one integrated circuit structure disposed (e.g., embedded) between surfaces of the semiconductor structures. A first integrated circuit structure (e.g., a 2D IC structure) in the semiconductor structures can be replaced by a second integrated circuit structure (e.g., a 3D IC structure) without substantially changing a distance between first and second surfaces of the semiconductor structures.

As one example, the process and materials developed for embedding the first IC structure (e.g., having a thickness of about seventy hundred fifty micron) can be used for embedding the second IC structure (e.g., having a thickness of about seven hundred sixty two micron) because thickness differences between the first IC structure and the second IC structure are within spacing tolerance limits of the first IC structure (e.g., about twenty micron) and/or tolerance limits of a pressed/laminated dielectric used to embed the first IC structure (e.g., to prevent the first IC structure from cracking during lamination).

In one aspect of the concepts described herein, a semiconductor structure includes at least two substrate layers, each of the at least two substrate layers having first and second opposing surfaces and a plurality of electrical connections extending between the first and second surfaces. Each of the at least two substrate layers include one or more interconnect pads having first and second opposing surfaces and one or more sides. The first surface of at least a first select one of the interconnect pads of a first one of the at least two substrate layers is disposed over or beneath select portions of the second surface of the first one of the substrate layers and is electrically coupled to select ones of the electrical connections in the first one of the substrate layers. Additionally, the first surface of at least a first select one of the interconnect pads of a second one of the at least two substrate layers is disposed over or beneath select portions of the first surface of the second one of the substrate layers and is electrically coupled to select ones of the electrical connections in the second one of the substrate layers.

The semiconductor structure also includes a substrate joining layer disposed between and coupled to the second surface of the first one of the substrate layers and the first surface of the second one of the substrate layers. The substrate joining layer has first and second opposing surfaces and a plurality of electrical connections extending between select portions of the first and second surfaces, and includes at least one integrated circuit (IC) structure disposed between the first and second surfaces of the substrate joining layer. The at least one IC structure has first and second opposing surfaces and includes one or more interconnect pads having first and second opposing surfaces and one or more sides. The first surface of at least a first select one of the interconnect pads is disposed over or beneath select portions of the first surface of the at least one IC structure and is electrically coupled to select ones of the electrical connections in the substrate joining layer.

The semiconductor structure may also include one or more of the following features individually or in combination with other features. The at least one IC structure of the substrate joining layer may include a two-dimensional (2D) IC structure and a three-dimensional (3D) IC structure. The substrate joining layer may include a first substrate joining layer portion having first and second opposing surfaces and a first plurality of electrical connections extending between select portions of the first and second surfaces. The first surface of the first substrate joining layer portion corresponds to the first surface of the substrate joining layer, and the 3D IC structure is disposed between the first and second surfaces of the first substrate joining layer. The 3D IC structure includes at least a first select interconnect pad disposed over or beneath select portions of the first surface of the 3D IC structure, the first select interconnect pad electrically coupled to first select ones of the first plurality of electrical connections in the first substrate joining layer portion.

The semiconductor structure may additionally include one or more of the following features individually or in combination with other features. The substrate joining layer may include a second substrate joining layer portion having first and second opposing surfaces and a second plurality of electrical connections extending between select portions of the first and second surfaces. The first surface of the second substrate joining layer portion corresponds to the second surface of said substrate joining layer, and the 2D IC structure is disposed between the first and second surfaces of the second substrate joining layer. The 2D IC structure includes at least a first select interconnect pad disposed over or beneath select portions of the first surface of the 2D IC structure, the first select interconnect pad electrically coupled to first select ones of the second plurality of electrical connections in the second substrate joining layer portion. The substrate joining layer may include an insulating layer having first and second opposing surfaces. The first surface of the insulating layer is coupled to the second surface of the first substrate joining layer portion, and the second surface of the insulating layer is coupled to the second surface of the second substrate joining layer portion.

The semiconductor structure may further include one or more of the following features individually or in combination with other features. The substrate joining layer may include openings formed in select portions of the insulating layer, the openings shaped to receive the 3D IC structure and the 2D IC structure. The first substrate joining layer portion may include a first substrate layer having first and second opposing surfaces and a plurality of electrical connections extending between the first and second surfaces. The first surface of the first substrate layer corresponds to the first surface of the first substrate joining layer portion and the plurality of electrical connections in the first substrate layer correspond to the first plurality of electrical connections in the first substrate joining layer portion. The substrate joining layer may include one or more interconnect pads having first and second opposing surfaces and one or more sides. The first surface of each one of the interconnect pads is disposed over or beneath select portions of the second surface of the first substrate layer and is electrically coupled to select ones of the electrical connections in the first substrate layer. The substrate joining layer may include one or more alignment marks disposed over or beneath the second surface of the first substrate layer and an adhesive layer having first and second opposing surfaces. The first surface of the adhesive layer is disposed over at least the second surface of the first substrate layer and the second surfaces and one or more sides of the interconnect pads, and the first surface of the 3D IC structure is disposed over or beneath select portions of the second surface of the adhesive layer and is aligned relative to at least one of the alignment marks.

The semiconductor structure may further include one or more of the following features individually or in combination with other features. The substrate joining layer may include one or more pad interconnects having at least one pad portion and at least one interconnect portion, the pad interconnects electrically coupled to at least the first select interconnect pad of the 3D IC structure. The pad portion of each one of the pad interconnects has a surface disposed over select portions of the first surface of the first substrate layer and the interconnect portion of each one of the pad interconnects extends from the pad portion to the second surface of at least the first select interconnect pad of the 3D IC structure. The first substrate joining layer portion may include a second substrate layer having first and second opposing surfaces and a plurality of electrical connections extending between the first and second surfaces. The first surface of the second substrate layer corresponds to the first surface of the second substrate joining layer portion and the plurality of electrical connections in the second substrate layer correspond to the second plurality of electrical connections in the second substrate joining layer portion.

The semiconductor structure may also include one or more of the following features individually or in combination with other features. The first substrate joining layer portion may include one or more interconnect pads having first and second opposing surfaces and one or more sides. The first surface of each one of the interconnect pads is disposed over or beneath select portions of the second surface of the second substrate layer and is electrically coupled to select ones of the electrical connections in the second substrate layer. The first substrate joining layer portion may include one or more alignment marks disposed over or beneath the second surface of the second substrate layer, and an adhesive layer having first and second opposing surfaces. The first surface of the adhesive layer is disposed over at least the second surface of the second substrate layer and the second surfaces and one or more sides of the interconnect pads, and the first surface of the 2D IC structure is disposed over or beneath select portions of the second surface of the adhesive layer and is aligned relative to at least one of the alignment marks.

The semiconductor structure may additionally include one or more of the following features individually or in combination with other features. The first substrate joining layer portion may include one or more pad interconnects having at least one pad portion and at least one interconnect portion, the pad interconnects electrically coupled to at least the first select interconnect pad of the 2D IC structure. The pad portion of each one of the pad interconnects has a surface disposed over select portions of the first surface of the second substrate layer and the interconnect portion of each one of the pad interconnects extends from the pad portion to the second surface of at least the first select interconnect pad of the 2D IC structure. The first surface of said substrate joining layer may be electrically coupled to the second surface of the first select one of the interconnect pads of the first one of the substrate layers, and the second surface of said substrate joining layer may be electrically coupled to the second surface of the second select one of the interconnect pads of the second one of the substrate layers to form one or more electrical connections between the first one of the substrate layers and the second one of the substrate layers.

The semiconductor structure may further include one or more of the following features individually or in combination with other features. A 2D IC structure disposed over and coupled to the first surface of said first substrate layer or the second surface of the second substrate layer, the 2D IC structure having first and second opposing surfaces and one or more interconnect pads, and the interconnect pads having first and second opposing surfaces and one or more sides. The first surface of at least a first select one of the interconnect pads of the 2D IC structure is disposed over or beneath select portions of the first surface of the 2D IC structure. A 3D IC structure disposed over and coupled to the first surface of the first substrate layer or the second surface of said second substrate layer, the 3D IC structure having first and second opposing surfaces and one or more interconnect pads, and the interconnect pads having first and second opposing surfaces and one or more sides. The first surface of at least a first select one of the interconnect pads of the 3D IC structure is disposed over or beneath select portions of the first surface of the 3D IC structure.

The semiconductor structure may also include one or more of the following features individually or in combination with other features. One or more fusible coupling structures disposed between and electrically coupled to the second surface of at least the first select one of the interconnect pads of the 2D IC structure and the second surface of a second select one of the interconnect pads of the second one of the substrate layers. The first surface of the second select one of the interconnect pads is disposed over or beneath select portions of the second surface of the second one of the substrate layers and is electrically coupled to second select ones of the electrical connections in the second one of the substrate layers. One or more fusible coupling structures disposed between and electrically coupled to the second surface of at least the first select one of the interconnect pads of the 3D IC structure and the second surface of a third select one of the interconnect pads of the second one of the substrate layers. The first surface of the third select one of the interconnect pads is disposed over or beneath select portions of the second surface of the second one of the substrate layers and is electrically coupled to third select ones of the electrical connections in the second one of the substrate layers.

The semiconductor structure may additionally include one or more of the following features individually or in combination with other features. A heat dissipation structure having first and second opposing surfaces, with a first surface of the heat dissipation structure disposed over and coupled to at least one of the second surface of the 2D IC structure and the second surface of the 3D IC structure. A thermal interface structure disposed between the first surface of the heat dissipation structure and the second surface of the 2D IC structure and/or the first surface of the heat dissipation structure and the second surface of the 3D IC structure. The first surface of the heat dissipation structure may be further disposed over and coupled to the second surface of at least a fourth select one of the interconnect pads of the second one of the substrate layers. The first surface of the fourth select one of the interconnect pads is disposed over or beneath select portions of the second surface of the second one of the substrate layers and is electrically coupled to fourth select ones of the electrical connections in the second one of the substrate layers.

The semiconductor structure may further include one or more of the following features individually or in combination with other features. One or more fusible coupling structures disposed between the first and second surfaces of the substrate joining layer and electrically coupled to the second surface of at least the first select one of the interconnect pads of the first one of the substrate layers and to the second surface of at least the first select one of the interconnect pads of the second one of the substrate layers to form an interconnect for electrically and mechanically coupling the first one of the substrate layers to the second one of the substrate layers. The fusible coupling structures may be provided as at least one of a solder ball and a self-aligned contact pad. At least one of the first one of the substrate layers and the second one of the substrate layers may be a multi-layer substrate. The semiconductor structure may be integrated into a communications device.

In one aspect of the concepts described herein, a method for fabricating a semiconductor structure includes providing at least two substrate layers, each of the at least two substrate layers has first and second opposing surfaces and a plurality of electrical connections extending between the first and second surfaces. Each of the at least two substrate layers includes one or more interconnect pads having first and second opposing surfaces and one or more sides. The first surface of at least a first select one of the interconnect pads of a first one of the at least two substrate layers is disposed over or beneath select portions of the second surface of the first one of the substrate layers and is electrically coupled to select ones of the electrical connections in the first one of the substrate layers. Additionally, the first surface of at least a first select one of the interconnect pads of a second one of the at least two substrate layers is disposed over or beneath select portions of the first surface of the second one of the substrate layers and is electrically coupled to select ones of the electrical connections in the second one of the substrate layers.

The method additionally includes providing a substrate joining layer having first and second opposing surfaces and a plurality of electrical connections extending between select portions of the first and second surfaces. The substrate joining layer includes at least one integrated circuit (IC) structure disposed between the first and second surfaces of the substrate joining layer. The at least one IC structure has first and second opposing surfaces and includes one or more interconnect pads having first and second opposing surfaces and one or more sides. The first surface of at least a first select one of the interconnect pads is disposed over or beneath select portions of the first surface of the at least one IC structure and is electrically coupled to select ones of the electrical connections in the substrate joining layer.

The method also includes coupling the first surface of the substrate joining layer to the second surface of the first one of the substrate layers to form one or more electrical connections between the substrate joining layer and the first one of the substrate layers. The method further includes coupling the second surface of the substrate joining layer to the first surface of the second one of the substrate layers to form one or more electrical connections between the substrate joining layer and the second one of the substrate layers.

The method may include one or more of the following features either individually or in combination with other features. Providing a substrate joining layer having first and second opposing surfaces and a plurality of electrical connections extending between select portions of the first and second surfaces may include providing a first substrate joining layer portion having first and second opposing surfaces and a first plurality of electrical connections extending between select portions of the first and second surfaces. The first substrate joining layer portion may include one or more three-dimensional (3D) integrated circuit (IC) structures disposed between the first and second surfaces of the first substrate joining layer. Each of the 3D IC structures may include one or more interconnect pads having first and second opposing surfaces and one or more sides. The first surface of at least a first select one of the interconnect pads is disposed over or beneath select portions of the first surface of the 3D IC structures and is electrically coupled to first select ones of the first plurality of electrical connections in the first substrate joining layer portion.

The method may also include one or more of the following features either individually or in combination with other features. Providing a substrate joining layer may include providing a second substrate joining layer portion having first and second opposing surfaces and a second plurality of electrical connections extending between select portions of the first and second surfaces. The second substrate joining layer portion may include one or more two-dimensional (2D) IC structures disposed between the first and second surfaces of the first substrate joining layer. Each of the 2D IC structures may include one or more interconnect pads having first and second opposing surfaces and one or more sides. The first surface of at least a first select one of the interconnect pads is disposed over or beneath select portions of the first surface of the 2D IC structures and is electrically coupled to first select ones of the second plurality of electrical connections in the second substrate joining layer portion.

Providing a substrate joining layer may include providing an insulating layer having first and second opposing surfaces. Providing a substrate joining layer may include coupling the first surface of the insulating layer to the second surface of the first substrate joining layer portion and the second surface of the insulating layer to the second surface of the second substrate joining layer portion to form a substrate joining layer having first and second opposing surfaces and a plurality of electrical connections extending between select portions of the first and second surfaces. The first surface of the first substrate joining layer portion corresponds to the first surface of said substrate joining layer and the first surface of the second substrate joining layer portion corresponds to the second surface of said substrate joining layer.

The method may additionally include one or more of the following features either individually or in combination with other features. Providing an insulating layer having first and second opposing surfaces may include disposing an insulating material over the second surface of the first substrate joining layer portion, and forming an insulating layer having first and second opposing surfaces from the insulating material. The first surface of the insulating layer is disposed over the second surface of the first substrate joining layer portion. Providing an insulating layer having first and second opposing surfaces may include providing an insulating layer having first and second opposing surfaces and openings formed in select portions of the insulating layer. The openings may be shaped to receive the 3D IC structures and the 2D IC structures. The first surface of the insulating layer is disposed over and coupled to the second surface of the first substrate joining layer portion and the second surface of the insulating layer is disposed over and coupled to the first surface of the second substrate joining layer portion.

The method may further include one or more of the following features either individually or in combination with other features. Providing a first substrate joining layer portion having first and second opposing surfaces and a first plurality of electrical connections extending between select portions of the first and second surfaces may include providing a first substrate layer having first and second opposing surfaces and a plurality of electrical connections extending between the first and second surfaces. The first surface of the first substrate layer corresponds to the first surface of the first substrate joining layer portion and the plurality of electrical connections in the first substrate layer correspond to the first plurality of electrical connections in the first substrate joining layer portion.

Providing a first substrate joining layer portion may include providing one or more interconnect pads having first and second opposing surfaces and one or more sides. The first surface of each one of the interconnect pads is disposed over or beneath select portions of the second surface of the first substrate layer and is electrically coupled to select ones of the electrical connections in the first substrate layer. Providing a first substrate joining layer portion may include providing one or more alignment marks on the second surface of the first substrate layer. Providing a first substrate joining layer portion may include applying an adhesive layer having first and second opposing surfaces. The first surface of the adhesive layer is disposed over at least the second surface of the first substrate layer and the second surfaces and one or more sides of the interconnect pads.

The method may also include one or more of the following features either individually or in combination with other features. Providing a first substrate joining layer portion may include providing one or more three-dimensional (3D) IC structures having first and second opposing surfaces. The first surface of each one of the 3D IC structures is disposed over or beneath select portions of the second surface of the adhesive layer and each of the 3D IC structures is aligned relative to at least one of the alignment marks. Each of the 3D IC structures include one or more interconnect pads having first and second opposing surfaces and one or more sides. The first surface of at least a first select one of the interconnect pads is disposed over or beneath select portions of the first surface of the 3D IC structures.

Providing a first substrate joining layer portion may include forming openings having a predetermined shape in select portions of the first substrate layer and the adhesive layer. The openings extend between the first surface of the first substrate layer and the second surface of at least the first select one of the interconnect pads of the 3D IC structures. Providing a first substrate joining layer portion may include providing one or more pad interconnects having at least one pad portion and at least one interconnect portion, the pad interconnects electrically coupled to at least the first select one of the interconnect pads, wherein the pad portion of each one of the pad interconnects has a surface disposed over select portions of the first surface of the first substrate layer and the interconnect portion of each one of the pad interconnects extends from the pad portion to the second surface of at least the first select one of the interconnect pads and has a surface disposed over select edges of the openings formed in the first substrate layer and the adhesive layer.

The method may also include one or more of the following features either individually or in combination with other features. Providing a second substrate joining layer portion having first and second opposing surfaces and a second plurality of electrical connections extending between select portions of the first and second surfaces may include providing a second substrate layer having first and second opposing surfaces and a plurality of electrical connections extending between the first and second surfaces. The first surface of the second substrate layer corresponds to the first surface of the second substrate joining layer portion and the plurality of electrical connections in the second substrate layer correspond to the second plurality of electrical connections in the second substrate joining layer portion.

Providing a second substrate joining layer portion may include providing one or more interconnect pads having first and second opposing surfaces and one or more sides. The first surface of each one of the interconnect pads is disposed over or beneath select portions of the second surface of the second substrate layer and is electrically coupled to the plurality of electrical connections in the second substrate layer.

The method may additionally include one or more of the following features either individually or in combination with other features. Providing a second substrate joining layer portion may include providing one or more alignment marks on the second surface of the second substrate layer. Providing a second substrate joining layer portion may include applying an adhesive layer having first and second opposing surfaces. The first surface of the adhesive layer is disposed over at least the second surface of the second substrate layer and the second surfaces and one or more sides of the interconnect pads. Providing a second substrate joining layer portion may include providing one or more two-dimensional (2D) IC structures having first and second opposing surfaces. The first surface of each one of the 2D IC structures is disposed over or beneath select portions of the second surface of the adhesive layer and each of the 2D IC structures is aligned relative to at least one of the alignment marks Each of the 2D IC structures may include one or more interconnect pads having first and second opposing surfaces and one or more sides, wherein the first surface of at least a first select one of the interconnect pads is disposed over or beneath select portions of the first surface of the 2D IC structures. Providing a second substrate joining layer portion may include forming openings having a predetermined shape in select portions of the second substrate layer and the adhesive layer. The openings may extend between the first surface of the second substrate layer and the second surface of at least the first select one of the interconnect pads of the 2D IC structures. Providing a second substrate joining layer portion may include providing one or more pad interconnects having at least one pad portion and at least one interconnect portion, the pad interconnects electrically coupled to at least the first select one of the interconnect pads. The pad portion of each one of the pad interconnects has a surface disposed over select portions of the first surface of the second substrate layer and the interconnect portion of each one of the pad interconnects extends from the pad portion to the second surface of at least the first select one of the interconnect pads and has a surface disposed over select edges of the openings formed in the second substrate layer and the adhesive layer.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
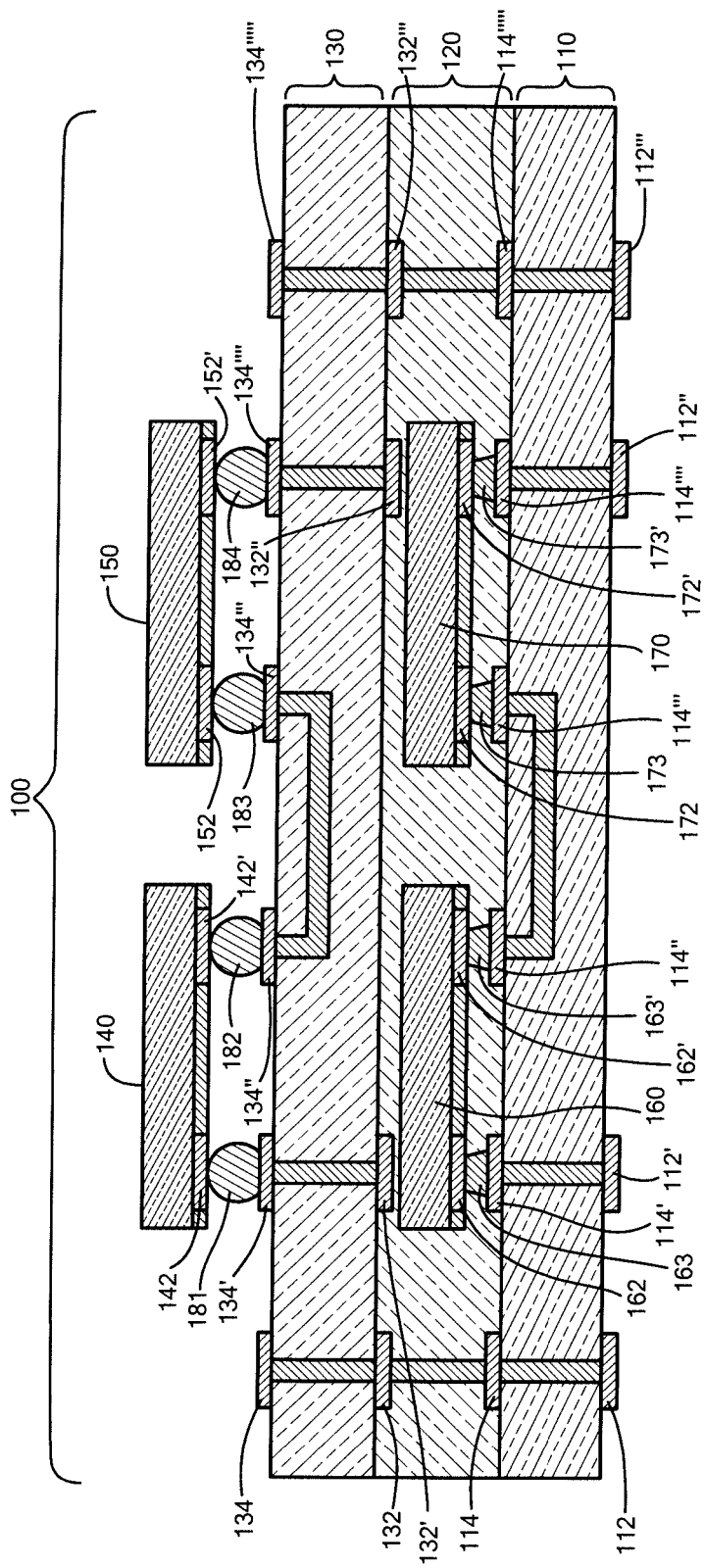
FIG. 1 is a block diagram of an example semiconductor structure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

Definitions

For convenience, certain introductory concepts and terms used in the specification are collected here.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or a reflow process.

As used herein, the term "conductive structure" is used to describe an interconnect structure for electrically coupling one or more interconnect pads, electrical connections, components, devices, modules, and semiconductor structures and devices. Printed circuit boards (PCBs), laminate chip carriers (LCCs), and like organic products and structures, which may include one or more conductive structures, permit the formation of multiple circuits using minimum volume or space. Such typically comprise a stack of electrically conductive layers of signal, ground and/or power planes separated from each other by at least one layer including an organic dielectric material (i.e., a dielectric layer). The planes may be in electrical contact with each other by plated holes passing through the dielectric layer(s). The plated holes are often referred to as vias if internally located, blind vias if extending a predetermined depth within the product or structure (e.g., PCB, LCC) from an external surface, or plated thru-holes (PTHs) if extending substantially through the product's or structure's full thickness. The term thru-hole as used herein is used to describe and meant to include vias, blind vias, and PTHs.

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

Additionally, while semiconductor structures including first and second substrate layers which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using first and second substrate layers which are different from each other.

Moreover, it should, of course, be appreciated that elements shown in the figures are not necessarily drawn to scale. For example, the dimensions of some elements may be exaggerated relative to other elements for clarity.

Referring now to FIG. 1, an example semiconductor structure 100 in accordance with the concepts, systems, circuits, and techniques sought to be protected herein is shown. The semiconductor structure 100 includes a first substrate layer 110, a second substrate layer 130 and a substrate joining layer 120. Each of the first and second substrate layers 110, 130 (e.g. single or multilayer substrates) has first and second opposing surfaces and a plurality of electrical connections (e.g., micro vias and/or sub-micron vias) extending between the first and second surfaces. Additionally, each of the first and second substrate layers 110, 130 includes one or more interconnect pads (e.g., 112) having first and second opposing surfaces and one or more sides.

First substrate layer 110 includes a first plurality of interconnect pads (here, interconnect pads 112, 112', 112", 112''') and a second plurality of interconnect pads (here, interconnect pads 114, 114', 114", 114''', 114'''', 114''''') in the illustrated embodiment. Each of interconnect pads 112, 112', 112", 112''' (e.g., solderable metal pads) has a first surface which is disposed over or beneath select portions of the first surface of the first substrate layer 110, and each of interconnect pads 114, 114', 114", 114''', 114'''', 114''''' has a first surface which is disposed over or beneath select portions of the second surface of the first substrate layer 110.

Interconnect pads 112, 114 are electrically coupled to first select ones of the electrical connections in the first substrate layer 110, interconnect pads 112', 114' are electrically coupled to second select ones of the electrical connections in the first substrate layer 110, and interconnect pads 114", 114''' are electrically coupled to third select ones of the electrical connections in the first substrate layer 110. Additionally, interconnect pads 112", 114" are electrically coupled to fourth select ones of the electrical connections in the first substrate layer 110, and interconnect pads 112''', 114'''' are electrically coupled to fifth select ones of the electrical connections in the first substrate layer 110.

Second substrate layer 130 also includes a first plurality of interconnect pads (here, interconnect pads 132, 132', 132", 132''') and a second plurality of interconnect pads (here, interconnect pads 134, 134', 134", 134''', 134'''', 134''''') in the illustrated embodiment. Each of interconnect pads 132, 132', 132", 132''' has a first surface which is disposed over or beneath select portions of the first surface of the second substrate layer 130, and each of interconnect pads 134, 134', 134", 134''', 134'''', 134''''' has a first surface which is disposed over or beneath select portions of the second surface of the second substrate layer 130.

Interconnect pads 132, 134 are electrically coupled to first select ones of the electrical connections in the second substrate layer 130, interconnect pads 132', 134' are electrically coupled to second select ones of the electrical connections in the second substrate layer 130, and interconnect pads 134", 134''' are electrically coupled to third select ones of the electrical connections in the second substrate layer 130. Additionally, interconnect pads 132", 134"" are electrically coupled to fourth select ones of the electrical connections in the second substrate layer 130, and interconnect pads 112''', 114""' are electrically coupled to fifth select ones of the electrical connections in the second substrate layer 130. In some embodiments, one or more the select ones (e.g., first select ones) of the electrical connections in the first and second substrate layers 110, 130 are the same as one or more of the other select ones (e.g., second select ones) of the electrical connections in the first and second layers 110, 130, respectively.

Substrate joining layer 120, which may be provided from a circuitized substrate, for example, has first and second opposing surfaces and a plurality of electrical connections extending between select portions of the first and second surfaces. The substrate joining layer 120 is disposed between and coupled to the second surface of the first substrate layer 110 and the first surface of the second substrate layer 130.

The substrate joining layer 120 includes a two-dimensional (2D) integrated circuit (IC) structure 160 and a three-dimensional (3D) IC structure 170 in the illustrated embodiment, each disposed (e.g., embedded) between the first and second surfaces of the substrate joining layer 120. In one embodiment, the substrate joining layer 120 is provided from a dielectric material (e.g., cured or uncured), the dielectric material having openings to accommodate each of the 2D IC structure 160 and 3D IC structure 170. Additionally, in one embodiment, the substrate joining layer 120 includes a plurality of dielectric layers (e.g., as may be provided from one or more dielectric materials). A first one of the dielectric layers may be a cured or uncured dielectric layer with an opening, a second one of the dielectric layers may be a cured or partially cured dielectric layer disposed over a first select surface (e.g., a first surface) of each of the 2D IC structure 160 and 3D IC structure 170, and a third one of the dielectric layers may be a cured or partially cured dielectric layer disposed over a second select surface (e.g., a second surface) of each of the 2D IC structure IC and 3D IC structure 170. Further, in one embodiment, the process and materials used to embed a 3D IC structure (e.g., 170) in a substrate joining layer (e.g., 120) are substantially the same as the process and materials used to embed a 2D IC structure (e.g., 160) in the substrate joining layer, as will be discussed further below in conjunction with FIGS. 7-7F, for example.

The 2D IC structure 160 has first and second opposing surfaces and includes a plurality of interconnect pads (here, interconnect pads 162, 162'). A first surface of interconnect pad 162 is disposed over or beneath the first surface of the 2D IC structure 160 and a second opposing surface of interconnect pad 162 is electrically coupled to select ones (here, second select ones) of the electrical connections in the substrate joining layer 120. Additionally, a first surface of interconnect pad 162' is disposed over or beneath the first surface of the 2D IC structure 160 and a second opposing surface of interconnect pad 162' is electrically coupled to select ones (here, third select ones) of the electrical connections in the substrate joining layer 120.

The 2D IC structure 160 also includes a plurality of interconnects (here, interconnects 163, 163'), each of which may be provided as a pad interconnect (e.g., 770, as will be discussed). Interconnect 163 has a first portion which is electrically coupled to the second surface of interconnect pad 162 of 2D IC structure 160 and a second opposing portion which is electrically coupled to the second surface of interconnect pad 114' of the first substrate layer 110. Additionally, interconnect 163' has a first portion which is electrically coupled to the second surface of interconnect pad 162' of 2D IC structure 160 and a second opposing portion which is electrically coupled to the second surface of interconnect pad 114" of the first substrate layer 110.

The 3D IC structure 170 has first and second opposing surfaces and includes a plurality of interconnect pads (here, interconnect pads 172, 172'). A first surface of interconnect pad 172 is disposed over or beneath the first surface of the 3D IC structure 170 and a second opposing surface of interconnect pad 172 is electrically coupled to select ones (here, fourth select ones) of the electrical connections in the substrate joining layer 120. Additionally, a first surface of interconnect pad 172' is disposed over or beneath the first surface of the 3D IC structure 170 and a second opposing surface of interconnect pad 172' is electrically coupled to select ones (here, fifth select ones) of the electrical connections in the substrate joining layer 120.

Similar to 2D IC structure 160, the 3D IC structure 170 also includes a plurality of interconnects (here, interconnects 173, 173'), each of which may be provided as a pad interconnect (e.g., 770, as will be discussed). Interconnect 173 has a first portion which is electrically coupled to the second surface of interconnect pad 172 of 3D IC structure 170 and a second opposing portion which is electrically coupled to the second surface of interconnect pad 114''' of the first substrate layer 110. Additionally, interconnect 173' has a first portion which is electrically coupled to the second surface of interconnect pad 172' of 3D IC structure 170 and a second opposing portion which is electrically coupled to the second surface of interconnect pad 114"" of the first substrate layer 110.

In one embodiment, a predetermined distance between about one hundred micron and about five hundred micron exists between the first and second surfaces of the substrate joining layer 120, with the predetermined distance corresponding to a height (i.e., thickness) of the substrate joining layer 120. Additionally, in one embodiment the 2D IC structure 160 (e.g., a 2D IC structure including one device layer and an interconnect) can be replaced by a 3D IC structure (e.g., 170) without substantially changing the height of the substrate joining layer 120. As one example, the 2D IC structure 160 may have a height of about one hundred fifty micron and may require a substrate joining layer 120 having a height of between about one hundred seventy five micron and about two hundred micron. A substrate joining layer (e.g., 120) having the same height can be used to embed an about one hundred sixty two micron 3D IC structure, for example, which has two extra device layers. One example 3D IC structure suitable for the 3D IC structure is described in in co-pending U.S. patent application Ser. No. 14/694,540 entitled "Interconnect Structures For Fine Pitch Assembly Of Semiconductor Structures," which is assigned to the assignee of the present disclosure and incorporated herein by reference in its entirety. Another example 3D IC structure suitable for the 3D IC structure is described in co-pending International Application No. PCT/

US2015/044608 entitled "Interconnect Structures For Assembly of Multi-layer Semiconductor Devices," which is assigned to the assignee of the present disclosure and incorporated herein by reference in its entirety.

In the illustrated embodiment, a first predetermined distance (e.g., one hundred micron) exists between the second surface of 2D IC structure 160 and the second surface of substrate joining layer 120. Additionally, a second predetermined distance (e.g., five hundred micron) exists between the second surface of 3D IC structure 170 and the second surface of substrate joining layer 120. The first and second predetermined distances may, for example, be selected to accommodate for height (i.e., thickness) differences between 2D IC structure 160 and 3D IC structure 170. In some embodiments, the first and second predetermined distances are substantially the same.

The semiconductor structure 100 additionally includes a 2D IC structure 140 and a 3D IC structure 150 disposed over the second surface of the second substrate layer 130 in the illustrated embodiment. The 2D IC structure 140, which may be the same as or similar to 2D IC structure 160 in some embodiments, has first and second opposing surfaces and a plurality of interconnect pads (here, interconnect pads 142, 142'). A first surface of interconnect pad 142 is disposed over or beneath the first surface of the 2D IC structure 140 and a second opposing surface of interconnect pad 142 is electrically coupled to the second surface of interconnect pad 134' of the second substrate layer 130. Additionally, a first surface of interconnect pad 142' is disposed over or beneath the first surface of the 2D IC structure 140 and a second opposing surface of interconnect pad 142' is electrically coupled to the second surface of interconnect pad 134" of the second substrate layer 130.

The 3D IC structure 150, which may be the same as or similar to 3D IC structure 170 in some embodiments, has first and second opposing surfaces and a plurality of interconnect pads (here, interconnect pads 152, 152'). A first surface of interconnect pad 152 is disposed over or beneath the first surface of the 3D IC structure 150 and a second opposing surface of interconnect pad 152 is electrically coupled to the second surface of interconnect pad 134"' of the second substrate layer 130. Additionally, a first surface of interconnect pad 152' is disposed over or beneath the first surface of the 3D IC structure 150 and a second opposing surface of interconnect pad 152' is electrically coupled to the second surface of interconnect pad 134"" of the second substrate layer 130.

In the example embodiment shown, interconnect pads 142, 142' of the 2D IC structure 140 and interconnect pads 152, 152' of the 3D IC structure 150 are electrically coupled to the interconnect pads 132, 132', 132", 132'" of the second substrate layer 130 through fusible coupling structures 181, 182, 183, 184 (e.g., solder balls, self-aligned contact pads) which are disposed between the second surfaces of interconnect pads 142, 142', 152, 152' and interconnect pads 132, 132', 132", 132'", respectively. The fusible coupling structures 181, 182, 183, 184 may, for example, form a ball grid array (BGA) type package on the second surface of the second substrate layer 130.

Those of ordinary skill in the art will understand how to select the size, shape and electrically conductive materials of fusible coupling structures 181, 182, 183, 184 for a particular application (e.g., based on pitch and assembly risk sites). Example electrically conductive materials for fusible coupling structures 181, 182, 183, 184 include, but are not limited to: copper, aluminum, gold/nickel/Cu, gold/platinum/Titanium/Al, conductive fusible metals, and/or other suitable electrically conductive materials.

In some embodiments, substrate joining layer 120 electrically couples the second substrate layer 130 to the first substrate layer 110 such that one or more electrical connections are formed between the first substrate layer 110 and the second substrate layer 130 (e.g., as illustrated by the electrical connection formed between interconnect pad 112 of the first substrate layer 110 and interconnect pad 134 of the second substrate layer 130, and by the electrical connection formed between interconnect pad 112'" of the first substrate layer 110 and interconnect pad 134"" of the second substrate layer 130).

Additionally, in some embodiments, substrate joining layer 120 is formed on the second surface of the first substrate layer 110. Additionally, in some embodiments, substrate joining layer 120 is formed on the first surface of the second substrate layer 130.

Further, in some embodiments, the semiconductor structure 100 discussed above and one or more of the semiconductor structures of FIGS. 2-10 discussed below may include or be provided as part of a system such as a telecommunication system (e.g., in a handset or base station) or an information technology system or a circuit such as a filter circuit (e.g., a tunable radio-frequency (RF) filter circuit). The filter circuit may be integrated into a communications device.

Additional aspects of the concepts, systems, circuits and techniques sought to be protected herein, with particular emphasis on semiconductor interconnect structures (e.g., substrate joining layers) are described in conjunction with the figures below.

Figure 2:
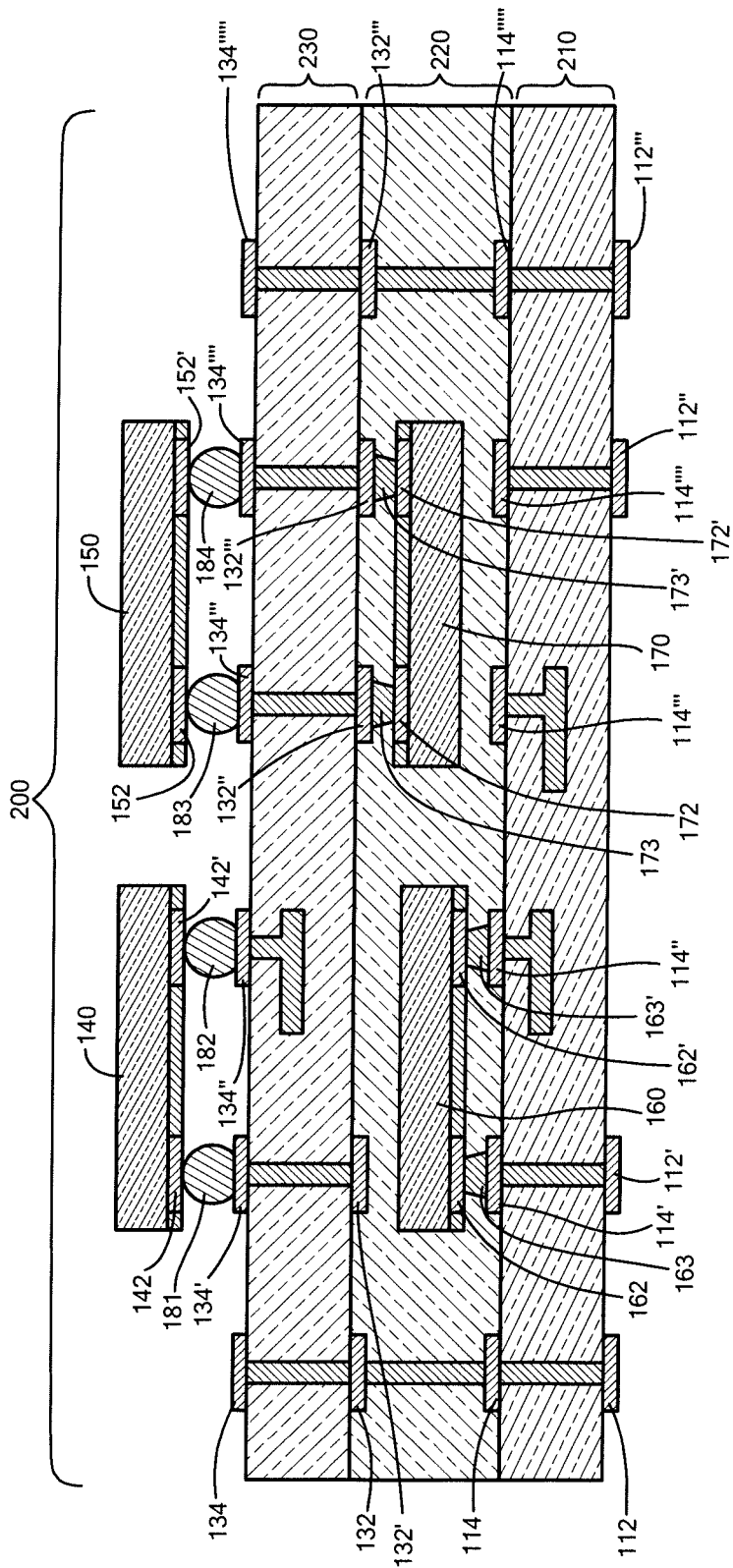
FIG. 2 is a block diagram of an example semiconductor structure similar to the semiconductor structure of FIG. 1, for example.

Referring now to FIG. 2, an example semiconductor structure 200 similar to semiconductor structure 100 of FIG. 1 is shown. The semiconductor structure 200 includes a first substrate layer 210, a second substrate layer 230 and a substrate joining layer 220. The semiconductor structure 200 also includes a 2D IC structure 140 and a 3D IC structure 150.

The first substrate layer 210 includes a first plurality of interconnect pads (here, interconnect pads 112, 112', 112", 112'") and a second plurality of interconnect pads (here, interconnect pads 114, 114', 114", 114'", 114"", 114""'). Interconnect pads 112, 114 are electrically coupled to first select ones of the electrical connections in the first substrate layer 210, interconnect pads 112', 114' are electrically coupled to second select ones of the electrical connections in the first substrate layer 210, and interconnect pad 114" is electrically coupled to third select ones of the electrical connections in the first substrate layer 210. Additionally, interconnect pads 112", 114'" are electrically coupled to fourth select ones of the electrical connections in the first substrate layer 210, interconnect pads 112'", 114"" are electrically coupled to fifth select ones of the electrical connections in the first substrate layer 210, and interconnect pads 112"", 114""' are electrically coupled to sixth select ones of the electrical connections in the first substrate layer 210.

The second substrate layer 230 includes a first plurality of interconnect pads (here, interconnect pads 132, 132', 132", 132'", 132"") and a second plurality of interconnect pads (here, interconnect pads 134, 134', 134", 134'", 134"", 134""'). Interconnect pads 132, 134 are electrically coupled to first select ones of the electrical connections in the second substrate layer 230, interconnect pads 132', 134' are electrically coupled to second select ones of the electrical connections in the second substrate layer 230, and interconnect pad 134" is electrically coupled to third select ones of the electrical connections in the second substrate layer 230. Additionally, interconnect pads 132", 114''' are electrically coupled to fourth select ones of the electrical connections in the second substrate layer 230, interconnect pads 132''', 114'''' are electrically coupled to fifth select ones of the electrical connections in the second substrate layer 230, and interconnect pads 132''', 134'''''' are electrically coupled to sixth select ones of the electrical connections in the second substrate layer 230.

The substrate joining layer 220 includes the 2D IC structure 160 and the 3D IC structure 170, each disposed (e.g., embedded) between the first and second surfaces of the substrate joining layer 120. The 2D IC structure 160 includes a plurality of interconnects (here, interconnects 163, 163'). Interconnect 163 has a first portion which is electrically coupled to the second surface of interconnect pad 162 of 2D IC structure 160 and a second opposing portion which is electrically coupled to the second surface of interconnect pad 114' of the first substrate layer 210. Additionally, interconnect 163' has a first portion which is electrically coupled to the second surface of interconnect pad 162' of 2D IC structure 160 and a second opposing portion which is electrically coupled to the second surface of interconnect pad 114'' of the first substrate layer 210.

The 3D IC structure 170, which is shown oriented in a different manner (i.e., rotated about one-hundred eighty degrees about the origin of substrate joining layer 230) than the 3D IC structure 170 shown in FIG. 1, for example, includes a plurality of interconnects (here, interconnects 173, 173'). Interconnect 173 has a first portion which is electrically coupled to the second surface of interconnect pad 172 of 3D IC structure 170 and a second opposing portion which is electrically coupled to the second surface of interconnect pad 132'' of the second substrate layer 230. Additionally, interconnect 173' has a first portion which is electrically coupled to the second surface of interconnect pad 172' of 3D IC structure 170 and a second opposing portion which is electrically coupled to the second surface of interconnect pad 132''' of the second substrate layer 230. It should, of course, be appreciated that 2D IC structure 160 and the 3D IC structure 170 can be oriented and electrically coupled in any number of manners, as will be apparent by those of ordinary skill in the art.

In one embodiment, first substrate layer 210 and second substrate layer 230 can be prepared differently. As one example, one substrate layer (e.g., 210) can have a 2D IC structure, one substrate layer (e.g., 230) can have a 3D IC structure, and the two substrate layers (e.g., 210, 230) can be attached with substrate joining layer 220 using one or more approaches. In one embodiment, first and second substrate layers 210, 230 have Plated thorough holes (PTH) with external pads for attachment to the substrate joining layer 220 (and for forming an electrical connection between first and second substrate layers 210, 230). Additionally, in one embodiment, substrate joining layer 220 can have an uncured or partially cured conducting metal and/or alloy filled via which cured during bonding to create an electrical connection between first and second substrate layers 210, 230. Further, in one embodiment, substrate joining layer 220 and first and second substrate layers 210, 230 are coupled together, and then PTHs are created to form an electrical connection between first and second substrate layers 210, 230.

Additionally, it is further possible to use one or more pins (e.g., male/female connections or pins/sockets) to create the electrical connection. For example, second substrate layer 230 can have pins and first substrate layer 210 can have openings for the pins. In such embodiment, substrate joining layer 220 can have openings shaped according to the pins and/or openings of the second substrate layer 230 and the first substrate layer 210, for example. Alternatively, the substrate joining layer 220 can have pins for substrate 210 openings and openings for substrate 230 pins. In some instances, the pins and openings of substrate joining layer 220 can be connected such that an electrical connection is formed between substrate 210 and substrate 230.

Further according to one aspect of the concepts, systems, circuits and techniques sought to be protected herein, there is provided a method of making a circuitized substrate assembly (e.g., as shown in FIGS. 1 and 2, and further described below). In such method, at least three circuitized substrate subassemblies (e.g., 110, 120, 130) are provided, each subassembly including at least one dielectric layer and at least one conductive layer including a plurality of metallic conductor pads (e.g., interconnect pads) as part thereof. At least some of these pads are attached to a 2D IC structure (e.g., 160) and/or a 3D IC structure (e.g., 170) using photolithographic plating processing and/or solder reflow and/or conductive paste curing or a combination thereof. Two or more such subassemblies are then aligned and laminated, using an interim organic so-called "pre-preg" layer to form a final multilayered assembly (e.g., 100). The circuitized substrate subassemblies are aligned relative to one another such that each of the metallic conductor pads of the first circuitized substrate subassembly (e.g., 110) are aligned with a corresponding metallic conductor pad of the second circuitized substrate subassembly (e.g., 120) in a facing manner, and such that each of the metallic conductor pads of the third circuitized substrate subassembly (e.g., 130) are aligned with a corresponding metallic conductor pad of the second circuitized substrate subassembly (e.g., 120), for example.

A flowable dielectric layer is positioned between each of the circuitized substrate subassemblies (e.g., 110, 120, 130), this flowable dielectric layer including a plurality of openings therein, each opening aligning with a respective pair of aligned and facing metallic conductor pads (e.g., interconnect pads) as well as the 2DIC (e.g., 160) and/or 3DIC (e.g., 170). A predetermined amount of a multilayer fusible metal paste and/or fusible metal coated single/multiple micro pillar is deposited on at least one of the metallic conductor pads of each of the pairs of aligned and facing metallic conductor pads. The circuitized substrate subassemblies are bonded together using heat and pressure so the metallurgies of the various layers of the fusible metal paste and metallic conductor pads are combined to form an electrical connection there between and the material of the flowable dielectric layer flows into the openings to substantially fill the openings and surround the 2D IC structure and/or 3D IC structure and electrical connections.

The electrical connection of fusible metal as used herein is used to describe and meant to include a bondable (e.g., capable of lamination) conductive material which, when laminated, results in a new composition at the bonding interface and/or at the joining interface of interconnects. The fusible metal can include Cu, tin, and/or lead particles and other pastes containing tin and silver particles which can form high melting tin-silver-Cu (SAC) or tin-lead or a tin-copper solid solution at the interface during lamination. Tin and silver particles can form tin-silver-Cu (SAC) or tin-copper solid solution with a Cu or micro pillar pad during lamination. Dielectric materials, thickness and processing require to embed a 2D IC structure can be used to embed a 3D IC structure. Thus, it is possible to maintain a same or similar embedding layer thickness as well as overall package thickness for an embedded 3D IC structure and an embedded 2D IC structure. Circuitized substrates with at least one 2D IC structure may be replaced by a 3D IC structure without changing total substrate thickness. Additionally, circuitized substrates with at least two 2D IC structures and at least one 2D IC structure may be replaced by a 3D IC structure without changing total embedding layer as well total substrate thickness.

Figure 3:
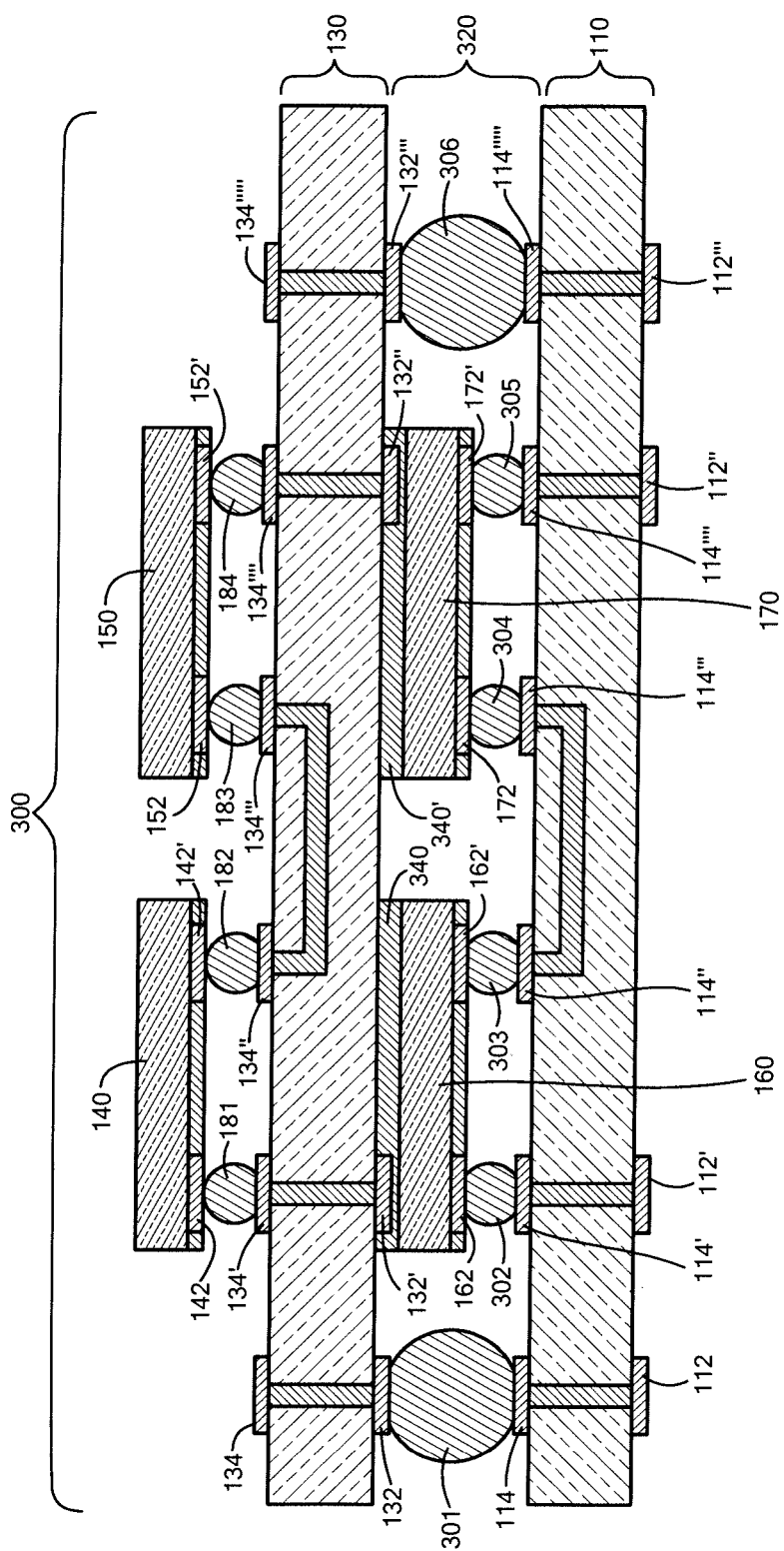
FIG. 3 is a block diagram of another example semiconductor structure.

Referring now to FIG. 3, another example semiconductor structure 300 includes the first substrate layer 110, the second substrate layer 130 and a substrate joining layer 320. Semiconductor structure 300 also includes the 2D IC structure 140 and a 3D IC structure 150.

The substrate joining layer 320 includes the 2D IC structure 160, the 3D IC structure 170, and a plurality of interconnect structures (here, interconnect structures 301, 302, 303, 304, 305, 306), each disposed between the first and second surfaces of the substrate joining layer 320. Interconnect structures 301, 302, 303, 304, 305, 306 may be provided as fusible coupling structures (as shown), pad interconnects (e.g., 770, as will be discussed), or a combination thereof, for example. Similar to fusible coupling structures 181, 182, 183, 184 of FIG. 1, the size, shape and electrically conductive materials of interconnect structures 301, 302, 303, 304, 305, 306 may be selected to achieve a desired pitch, for example. As one example, a pitch of between about one hundred twenty five micron and about one hundred fifty micron may be achieved in semiconductor structure 300 when a distance between first and second opposing surfaces of the substrate joining layer 320 is about one hundred fifty micron, and a distance between first and second opposing surfaces of the 2D IC structure 160 and/or 3D IC structure 170 is about seventy micron (e.g., an about one-to-three ratio between the distance of the 2D IC structure 160 and/or 3D IC structure 170 and the distance of the substrate joining layer 120). The size, shape and electrically conductive materials of interconnect structures 301, 302, 303, 304, 305, 306 may, for example, be selected based on the distance between the first and second surfaces of the substrate joining layer 320 to achieve the desired pitch. Thus, a thinner 2D IC structure 160 and/or 3D IC structure 170 may result in a decreased distance between the first and second surfaces of the substrate joining layer 320, and favor a finer pitch semiconductor structure 300.

Interconnect structure 301 has a first portion which is electrically coupled to the second surface of interconnect pad 114 of first substrate layer 110 and a second opposing portion which is electrically coupled to the second surface of interconnect pad 132 of second substrate layer 130. Additionally, interconnect structure 306 has a first portion which is electrically coupled to the second surface of interconnect pad 134'''' of first substrate layer 110 and a second opposing portion which is electrically coupled to the second surface of interconnect pad 132''' of second substrate layer 130.

In the illustrated embodiment, interconnect structure 301 and interconnect structure 306 each electrically couple the second substrate layer 130 to the first substrate layer 110 such that one or more electrical connections are formed between the first substrate layer 110 and the second substrate layer 130. A first electrical connection is formed between interconnect pad 112 of first substrate layer 110 and interconnect pad 134 of second substrate layer 130. Additionally, a second electrical connection is formed between interconnect pad 112''' of first substrate layer 110 and interconnect pad'''' 134 of second substrate layer 130.

Interconnect structure 302, which may be the same as or similar to interconnect 163 of FIG. 1 in some embodiments, has a first portion which is electrically coupled to the second surface of interconnect pad 162 of 2D IC structure 160 and a second opposing portion which is electrically coupled to the second surface of interconnect pad 114' of the first substrate layer 110. Additionally, interconnect structure 303, which may be the same as or similar to interconnect 163' of FIG. 1 in some embodiments, has a first portion which is electrically coupled to the second surface of interconnect pad 162' of 2D IC structure 160 and a second opposing portion which is electrically coupled to the second surface of interconnect pad 114" of the first substrate layer 110.

Interconnect structure 304, which may be the same as or similar to interconnect 173 of FIG. 1 in some embodiments, has a first portion which is electrically coupled to the second surface of interconnect pad 172 of 3D IC structure 170 and a second opposing portion which is electrically coupled to the second surface of interconnect pad 114''' of the first substrate layer 110. Additionally, interconnect structure 305, which may be the same as or similar to interconnect 173' of FIG. 1 in some embodiments, has a first portion which is electrically coupled to the second surface of interconnect pad 172' of 3D IC structure 170 and a second opposing portion which is electrically coupled to the second surface of interconnect pad 114'''' of the first substrate layer 110.

In the illustrated embodiment, a spacer material (e.g., a dielectric material) 390 exists between the second surface of 2D IC structure 160 and the second surface of substrate joining layer 320. Additionally, a spacer material 390' exists between the second surface of 3D IC structure 170 and the second surface of substrate joining layer 320. The spacer materials 390, 390' may, for example, be selected to accommodate for height differences between 2D IC structure 160 and 3D IC structure 170. In one embodiment, instead of spacer materials 390, 390', a gap (i.e., a cavity) exists between second surfaces of 2D IC structure 160 and 3D IC structure 170.

Figure 4:
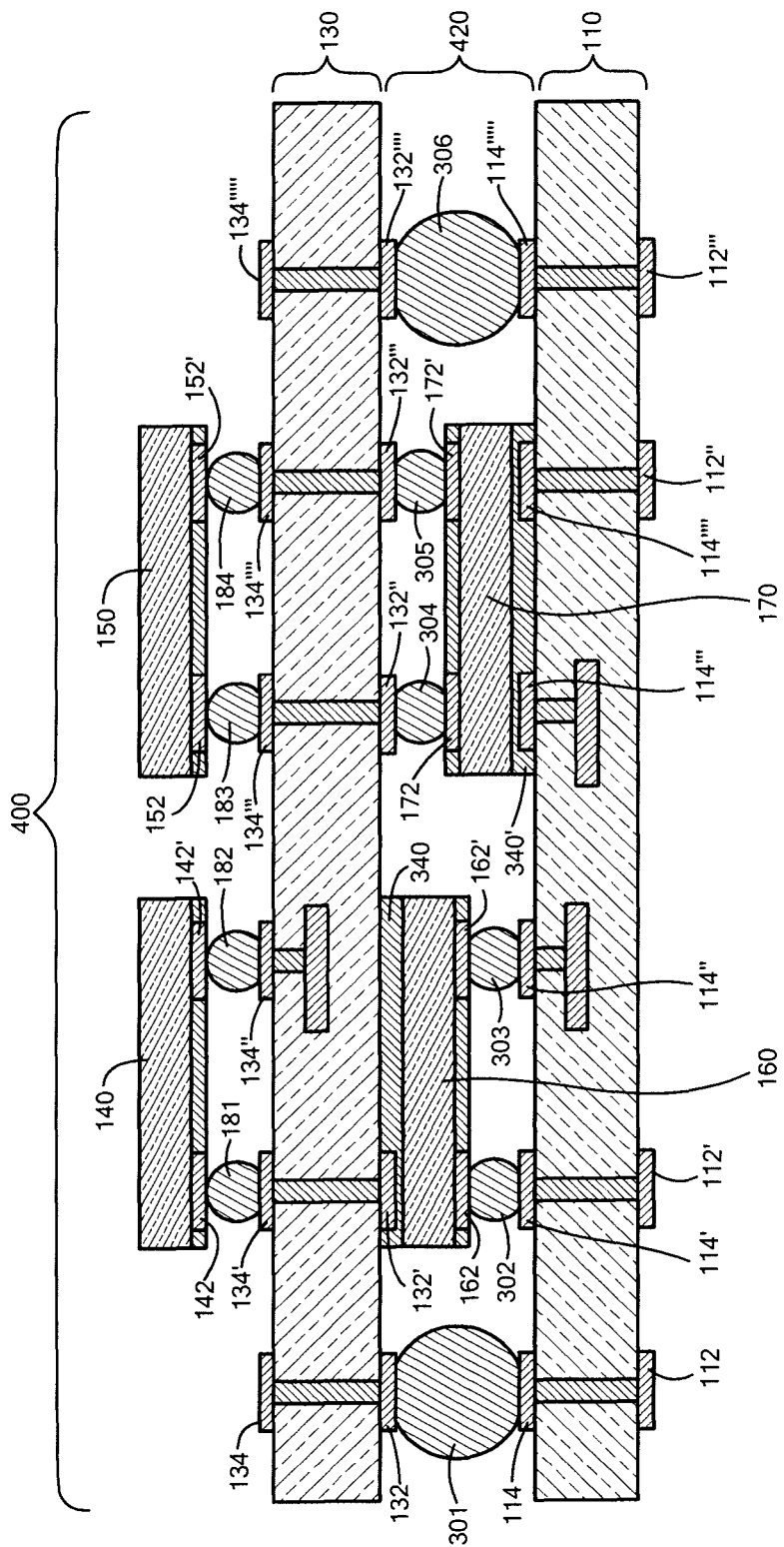
FIG. 4 is a block diagram of another example semiconductor structure.

Referring now to FIG. 4, another example semiconductor structure 400 includes the first substrate layer 210, the second substrate layer 230 and a substrate joining layer 320. Semiconductor structure 400 also includes the 2D IC structure 140 and a 3D IC structure 150.

The substrate joining layer 420 includes the 2D IC structure 160, the 3D IC structure 170, and a plurality of interconnect structures (here, interconnect structures 301, 302, 303, 304, 305, 306), each disposed between the first and second surfaces of the substrate joining layer 420. Interconnect structure 301 electrically couples the second surface of interconnect pad 214 of first substrate layer 210 to the second surface of interconnect pad 132 of second substrate layer 230. Additionally, interconnect structure 306 electrically couples the second surface of interconnect pad 214'''' of first substrate layer 210 to the second surface of interconnect pad 132'''' of second substrate layer 230.

Interconnect structures 302, 303, which are disposed between the second surfaces of interconnect pads 162, 162' of 2D IC structure 160 and the second surfaces of interconnect pads 134', 134" of first substrate layer 210, respectively, electrically couple the second surfaces of interconnect pads 162, 162' to the second surfaces of interconnect pads 134', 134". Additionally, interconnect structures 304, 305, which are disposed between the second surfaces of interconnect pads 172, 172' of 3D IC structure 170 and the second surfaces of interconnect pads 232", 232''' of second substrate layer 230, respectively, electrically couple the second surfaces of interconnect pads 172, 172' to the second surfaces of interconnect pads 232", 232'".

Figure 5:
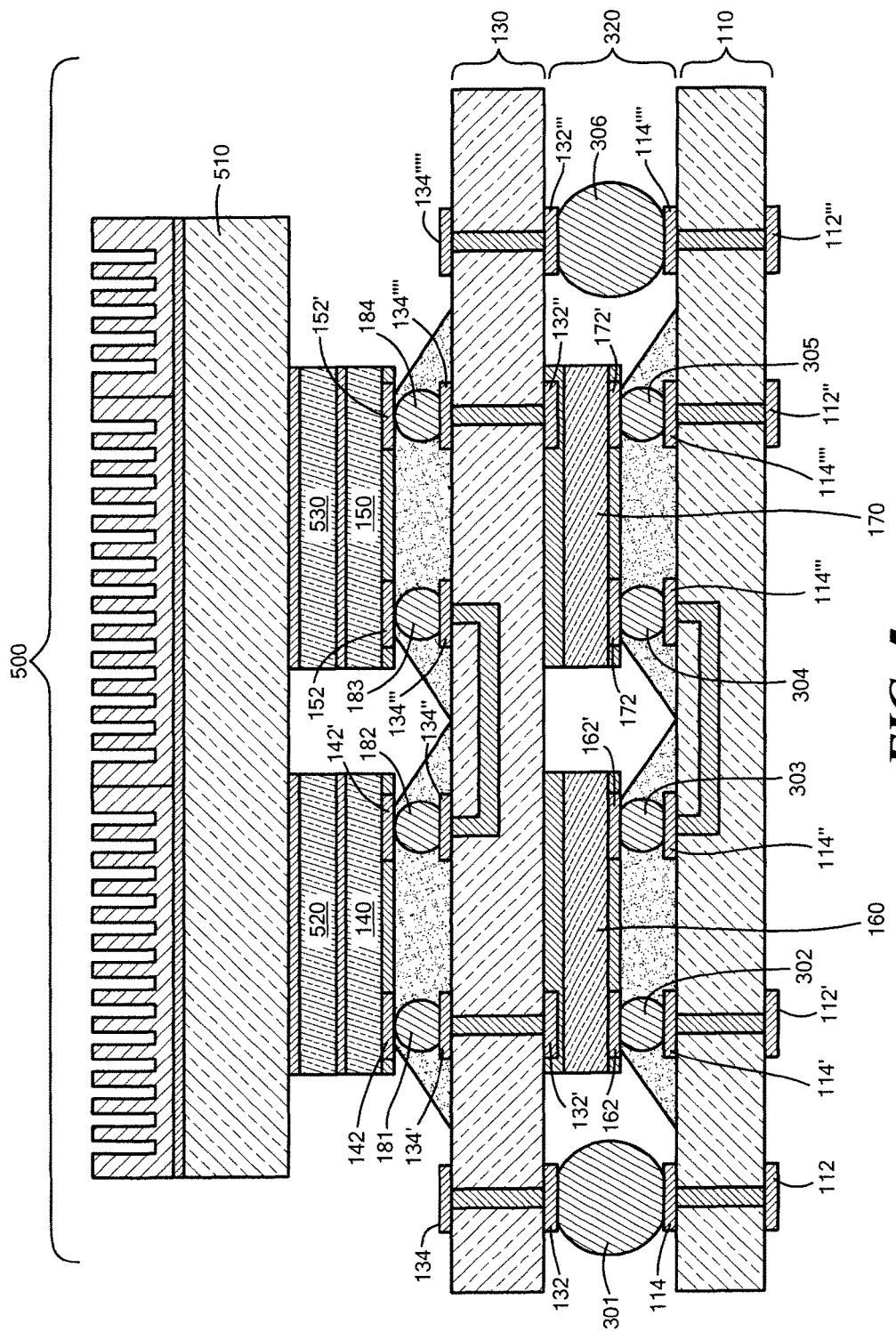
FIG. 5 is a block diagram of another example semiconductor structure similar to the semiconductor structure of FIG. 4, for example.

Referring now to FIG. 5, an example semiconductor structure 500 similar to semiconductor structure 300 of FIG. 3 is shown. The semiconductor structure 500 includes the first substrate layer 110, the second substrate layer 130, and the substrate joining layer 320. Semiconductor structure 300 also includes the 2D IC structure 140, the 3D IC structure 150, and an optional "underfill" material (i.e., an electrically-insulating material such as anisotropic conductive paste (ACP)) disposed between select portions of first surfaces of the IC structures (e.g., 140, 150, 160, 170) and second surfaces of the substrate layers (e.g., first substrate layer 110, second substrate layer 130). In one embodiment, the underfill material can be pre-applied before attaching the IC structures (e.g., 140, 150, 160, 170) or post applied (i.e., after attaching the IC structures (e.g., 140, 150, 160, 170). When post applied, for example, the underfill material may be dispensed while the substrates (e.g., 110, 130) are between an about thirty degree angle and an about sixty degree angle, and formed at a temperature around about 60 degrees Celsius.

Semiconductor structure 500 further includes a heat dissipation structure 510 (e.g., a heat sink device) and thermal interface structures 520, 530, each of which have first and second opposing surfaces in the illustrated embodiment. Thermal interface structure 520, which may include one or more thermal interface materials (e.g., thermally conductive adhesives (e.g., shin-etsu G-751, indium preform), has a first surface which is disposed over and coupled to a first surface of the heat dissipation structure 510 and a second opposing surface which is disposed over and coupled to the second surface of the 2DIC structure 140. Additionally, thermal interface structure 530, which may be the same as or similar to thermal interface structure 520 in some embodiments, has a first surface which is disposed over and coupled to the first surface of the heat dissipation structure 510 and a second opposing surface which is disposed over and coupled to the second surface of the 3DIC structure 150. Thermal interface structures 520, 530 may, for example, provide mechanical strength to the bond(s) formed between heat dissipation structure 510, 2D IC structure 140, and 3D IC structure 150 (i.e., resulting from the coupling), and/or reduce air gaps or spaces which may form between heat dissipation structure 510, 2D IC structure 140, and 3D IC structure 150 and act as a thermal insulator, which is undesirable for reasons apparent.

In some embodiments (not shown), the first surface of heat dissipation structure 510 is further disposed over and electrically coupled to the second surface of interconnect pad 134 of second substrate layer 130 and/or the second surface of interconnect pad 134''''' of second substrate layer 130.

Figure 6:
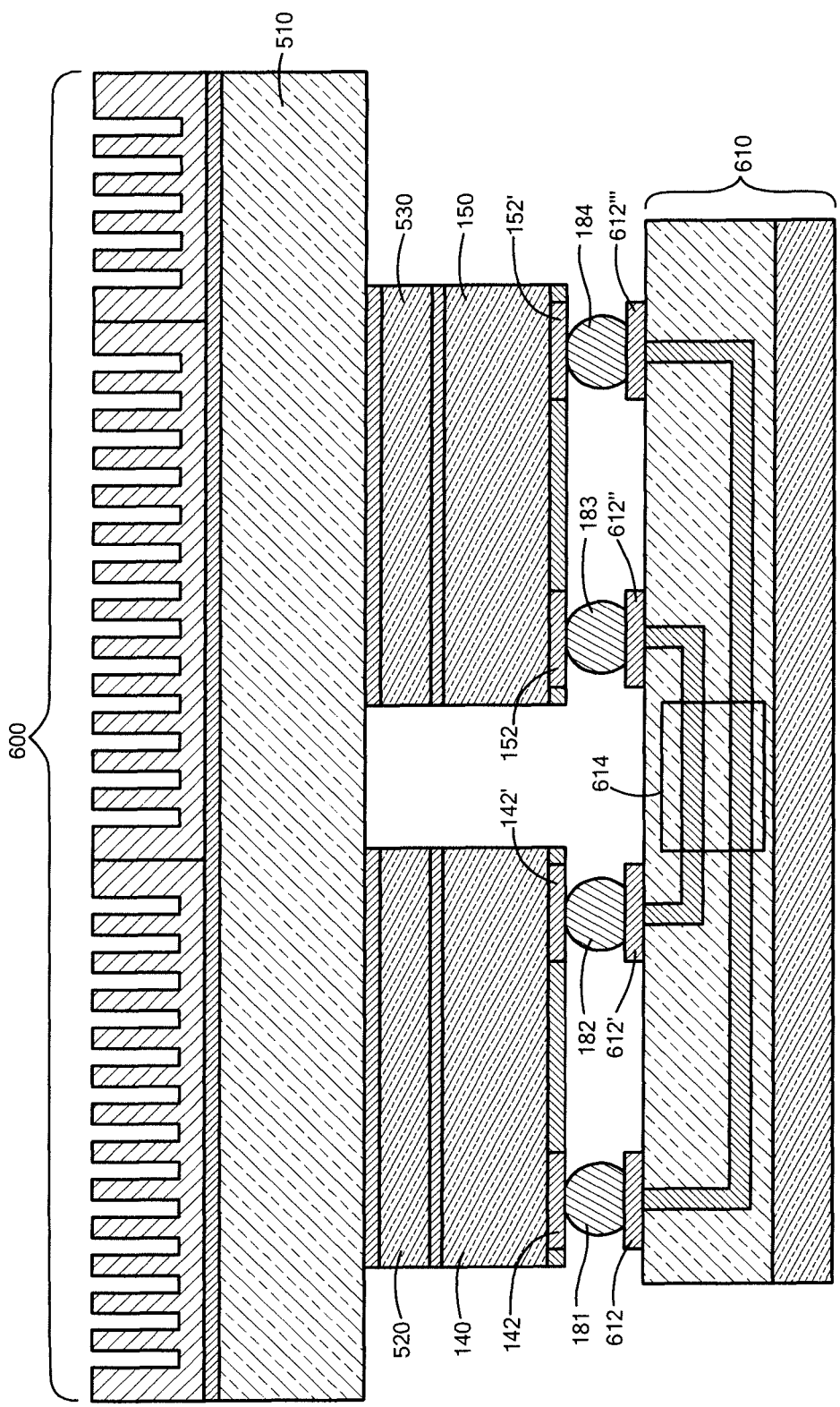
FIG. 6 is a block diagram of another example semiconductor structure.

Referring now to FIG. 6, another example semiconductor structure 600 includes 2D IC structure 140, 3D IC structure 150, heat dissipation structure 510 (e.g., a heat sink device), and thermal interface structures 520, 530. The semiconductor structure 600 also includes a multi-chip module (MCM) assembly 610.

MCM assembly 610 (e.g., a single or multi-layer MCM) has first and second opposing surfaces and a plurality of electrical connections extending between the first and second opposing surfaces. MCM assembly 610 also has a plurality of interconnect pads (here, interconnect pads 612, 612', 612", and 612'''). Interconnect pads 612 and 612''' are electrically coupled to first select ones of the electrical connections in the MCM assembly 610, and interconnect pads 612' and 612" are electrically coupled to second select ones of the electrical connections in the MCM assembly 610.

MCM assembly 610 also includes a semiconductor structure 614 having a first portion electrically coupled to the first select ones of the electrical connections and second portion electrically coupled to the second select ones of the electrical connections. In one embodiment, the semiconductor structure 614 corresponds to one or more of the semiconductor structures, or select portions (e.g., substrate layers, substrate joining layers) of the semiconductor structures, described above in conjunction with FIGS. 1-5 or below in conjunction with FIGS. 7-10. In one embodiment, thermal interface structures 520, 530 are provided from thermal interface materials (e.g., Indium preform) having a same or similar thickness, and are attached to the same heat dissipation structure 510 (e.g., 510) for efficient heat dissipation. Additionally, in one embodiment, the thermal interface materials (e.g., Indium preform) of thermal interface structures 520, 530 are compressed after bonding to the thermal interface structures 520, 530 to the heat dissipation structure 510 and to the 2D IC structure 140 and/or the 3D IC structure 150. The tolerance of the thermal interface materials is sufficient enough to compensate for thickness variations between the 2D IC structure 140 and the 3D IC structure 150.

Figure 7C:
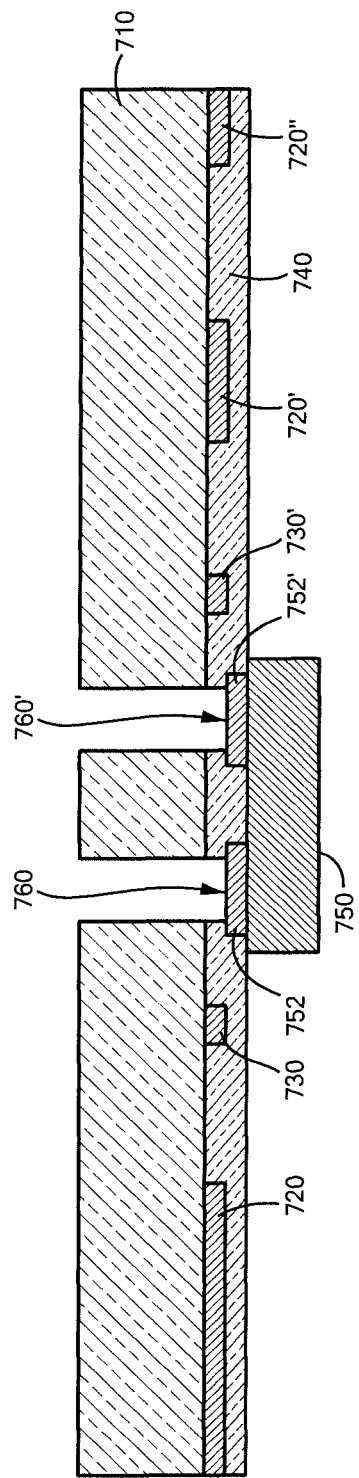
FIGS. 7-7F are example semiconductor structures as may be provided in an example method for fabricating a substrate joining layer in accordance with an embodiment.
Figure 7D:
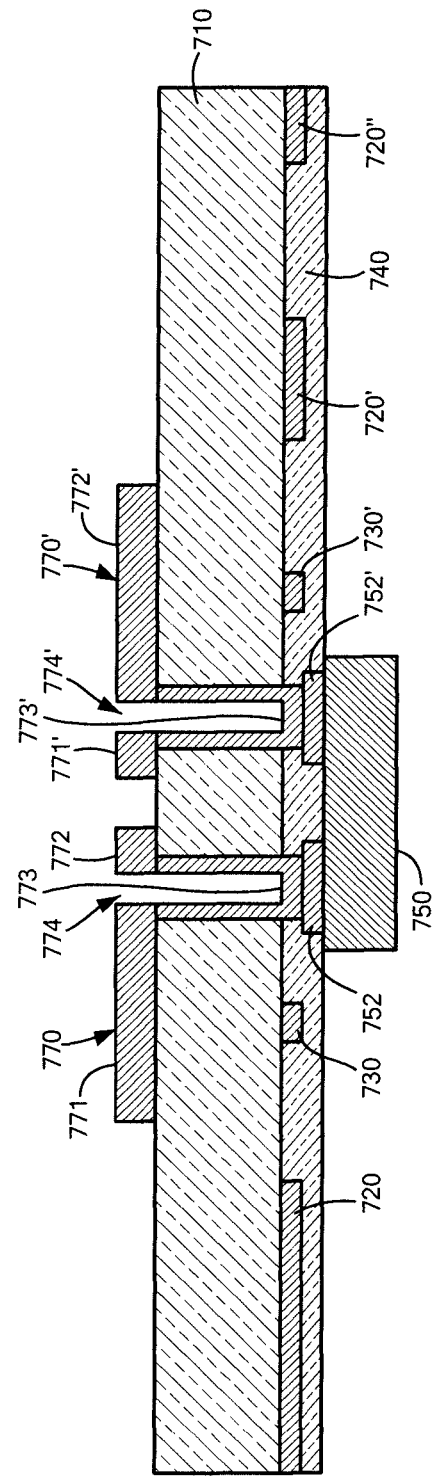
Figure 7E:
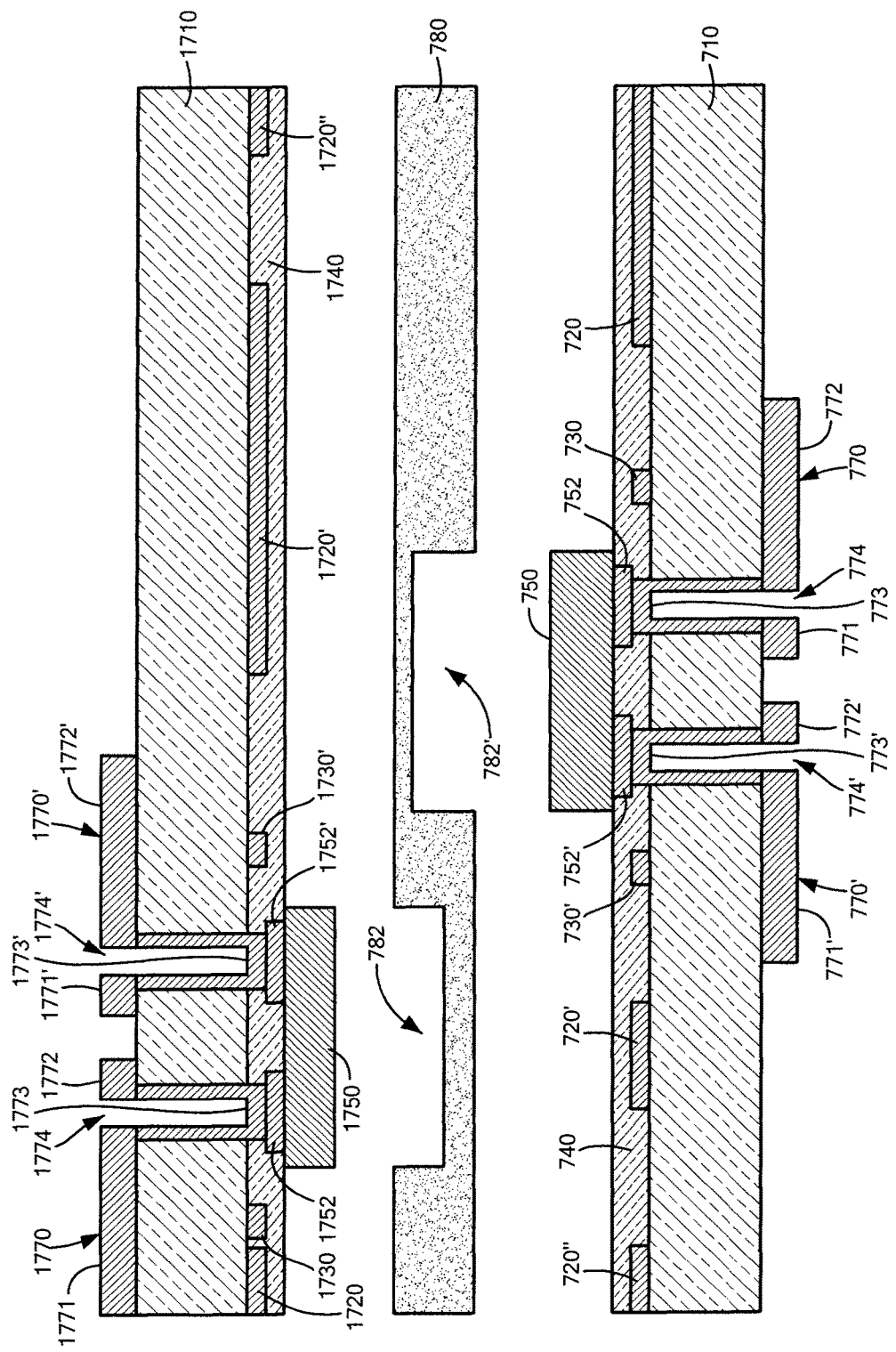
Figure 7F:
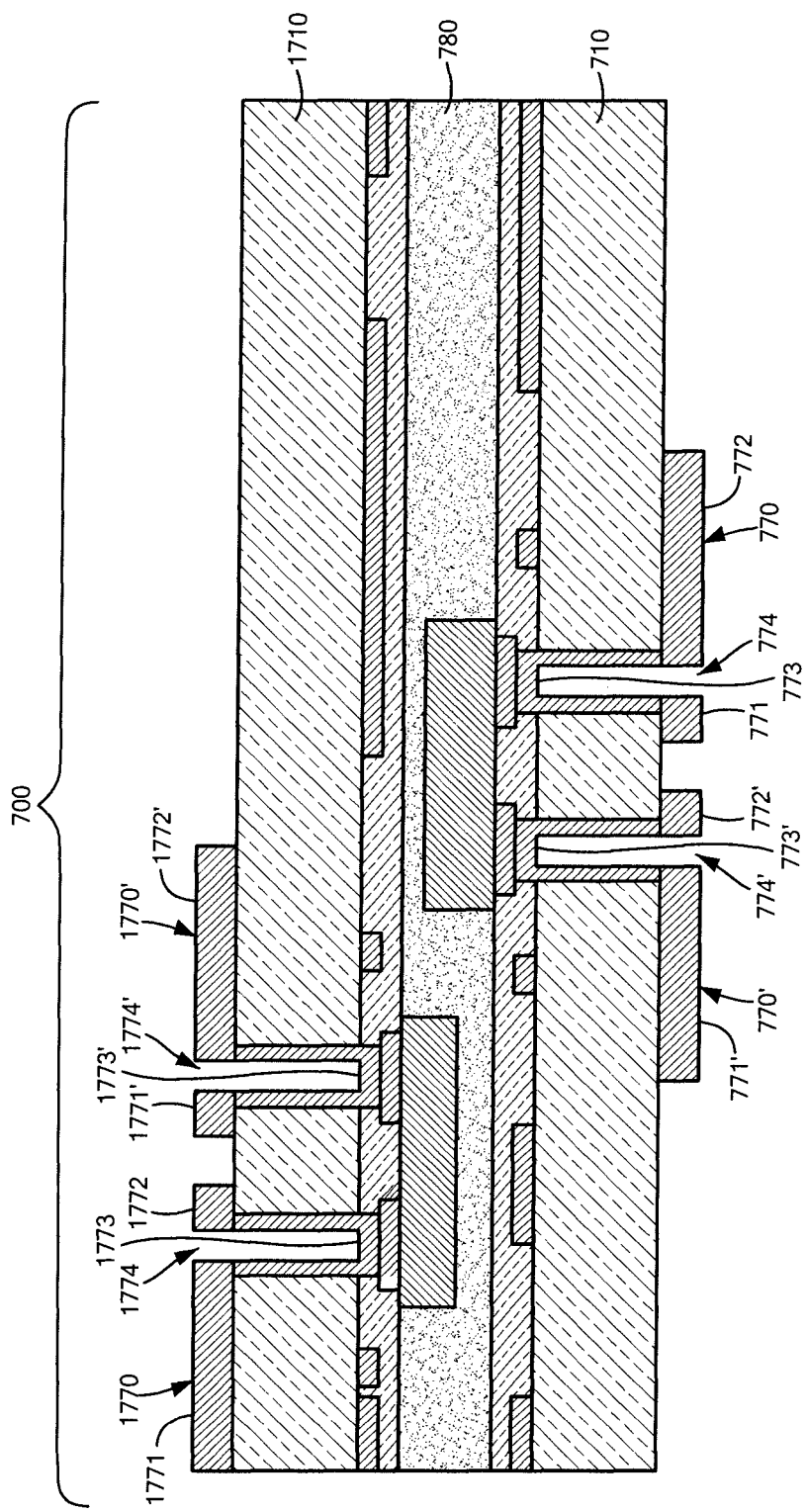

Referring now to FIGS. 7-7F, example semiconductor structures as may be provided in an example method for fabricating a substrate joining layer in accordance with the concepts, systems, circuits and techniques sought to be protected herein are shown. While FIGS. 7-7F are illustrated to comprise a sequence of processes, the example method is not limited to performing the illustrated processes in the sequence shown.

Referring now to FIG. 7, an example semiconductor structure (e.g., a wafer or die), which may correspond to a select portion (e.g., a first portion) of a substrate joining layer (e.g., substrate joining layer 700, as will be discussed), includes a first substrate layer (e.g., a single or multilayer substrate) 710, a plurality of interconnect pads (here, first, second and third interconnect pads 720, 720', 720"), and a plurality of alignment marks (here, first and second alignment marks 730, 730'). First substrate layer 710, which may be provided as a printed wiring board (PWB) in some embodiments, has first and second opposing surfaces and a plurality of electrical connections (e.g., vias) extending between the first and second surfaces. The electrical connections may, for example, be made by drilling holes through the first substrate layer 710 in appropriate locations and plating the inside of the holes with a conducting material (e.g., copper). Example materials suitable for first substrate layer 710 may include RO4000® series laminates by Rogers Corporation, Interra® HK 04J laminates by DuPont™, and DE104 laminates by Isola Group. Such materials are flexible and suitable for finer via and fine line pattering for high density applications. Additionally, in some embodiments, thermoset materials may be used instead of flexible materials. Further, in some embodiments, a combination of thermoset and thermoplastic materials may be used.

First, second, and third interconnect pads 720, 720', and 720" (e.g., solderable metal pads, circuit traces), which each have first and second opposing surfaces and a plurality of sides, are provided in a pattern or shape which promotes scalability of the semiconductor structure (e.g., for coupling the semiconductor structure to other semiconductor structures). A first surface of each one of the first, second, and third interconnect pads 720, 720', and 720" is disposed over or beneath (e.g., attached or otherwise coupled to) select portions of at least the first surface of first substrate layer 710 using techniques well known to those of ordinary skill in the art. The first surface of each one of the interconnect pads 720, 720', 720" is also electrically coupled to select ones of the plurality of electrical connections in first substrate layer 710. The electrical coupling may, for example, occur through bond wires or via contacts spaced between the first surface of interconnect pads 720, 720', 720" and the electrical connections in a region below the interconnect pads 720, 720', 720".

The interconnect pads 720, 720', 720", which may have a substantially circular, rectangular or square shape, for example, may be formed of a single layer of material, or multiple layers of material. Those of ordinary skill in the art will understand how to select the shape and size of interconnect pads 720, 720', 720" for a particular application (e.g., based on pitch and assembly risk sites). Example electrically conductive materials for interconnect pads 720, 720', 720" include, but are not limited to: copper, aluminum, gold/nickel/Cu, gold/platinum/Titanium/Al and/or other suitable electrically conductive materials.

In some embodiments, one or more of the interconnect pads 720, 720', 720" are embedded in the second surface of the first substrate layer 710, with the second surface of interconnect pads 720, 720', 720" extending a predetermined distance above the second surface of the first substrate layer 710. In some embodiments, this predetermined distance is zero.

First and second alignment marks 730, 730' are provided (e.g., etched or disposed) on the first surface of the first substrate layer 710. In some embodiments, the first and second alignment marks 730, 730' are provided from an electrically conductive material. Additionally, in some embodiments, the first and second alignment marks 730, 730' are the same as or similar to the interconnect pads 720, 720', 720".

Referring now to FIG. 7A, an example semiconductor structure includes first substrate layer 710, the plurality of interconnect pads (here, first, second, and third interconnect pads 720, 720', and 720"), the plurality of alignment marks (here, first and second alignment marks 730, 730'), and an adhesive layer 740. The adhesive layer 740, which may include one or more adhesive materials (e.g., glues, pastes, epoxies, adhesive tapes), has a first surface disposed over the first surface of the first substrate layer 710, the second surfaces and the sides of the first, second, and third interconnect pads 720, 720', and 720", and the first and second alignment marks 730, 730'. The adhesive layer 740 also has a second opposing surface, the second surface extending a predetermined distance above the second surfaces and sides of first, second, and third interconnect pads 720, 720', and 720". In some embodiments, this predetermined distance is zero. The adhesive layer 740 may be formed or solidified by exposing, developing, and/or curing the adhesive materials, which may include ultraviolet light curing adhesives, heat curing adhesives, moisture curing adhesives, for example, with an energy source, such as a light source, a curing oven or combination thereof.

Referring now to FIG. 7B, an example semiconductor structure includes first substrate layer 710, the plurality of interconnect pads (here, first, second, and third interconnect pads 720, 720', and 720"), the plurality of alignment marks (here, first and second alignment marks 730, 730'), adhesive layer 740, and a three-dimensional (3D) IC structure 750.

The 3D IC structure 750 has first and second opposing surfaces and includes a plurality of interconnect pads (here, first and second interconnect pads 752, 752'). First and second interconnect pads 752, 752' have first and second opposing surfaces and one or more sides, with the first surface of each of the first and second 752, 752' disposed over or beneath select portions of the first surface of the 3D IC structure 750. Additionally, the first surface of the 3D IC structure 750 is disposed over or beneath select portions of the second surface of the adhesive layer 740, with the 3D IC structure 750 aligned relative to at least one of the first and second alignment marks 730, 730'.

Referring now to FIG. 7C, an example semiconductor structure includes first substrate layer 710, the plurality of interconnect pads (here, first, second, and third interconnect pads 720, 720', and 720"), the plurality of alignment marks (here, first and second alignment marks 730, 730'), adhesive layer 740, and the three-dimensional (3D) IC structure 750.

The semiconductor structure also includes a plurality of openings (here, first and second openings 760, 760'), the first opening 760 extending between the second surface of the first substrate layer 710 and the second surface of the first interconnect pad 752, and the second opening 760' extending between the second surface of the first substrate layer 710 and the second surface of the second interconnect pad 752'. First and second openings 760, 760', which may be formed through a drilling or etching process, for example, have a predetermined shape. The predetermined shape may be selected to accommodate pad interconnects (e.g., pad interconnects 770, 770', as will be discussed).

Referring now to FIG. 7D, an example semiconductor structure includes first substrate layer 710, the plurality of interconnect pads (here, first, second, and third interconnect pads 720, 720', and 720"), the plurality of alignment marks (here, first and second alignment marks 730, 730'), adhesive layer 740, the three-dimensional (3D) IC structure 750, and the plurality of openings (e.g., openings 760, 760', as shown in FIG. 7C).

The semiconductor structure also includes a plurality of pad interconnects (here, first and second pad interconnects 770, 770'). First pad interconnect 770 (e.g., an electrically conductive structure formed from a plated metal material, for example) includes a first pad portion 771, a second pad portion 772, and an interconnect portion 773. Additionally, second pad interconnect 770' includes a first pad portion 771', a second pad portion 772', and an interconnect portion 773'. Dimensions of each of the pad portions 771, 772, 771', 772' and interconnect portions 773, 773' may be selected based on a desired spread of solder within cavities (e.g., cavities 774, 774') formed between select surfaces of the pad portions 771, 772, 771', 772' and interconnect portions 773, 773'. Such solder may, for example, be produced during a process for coupling the semiconductor structure of FIG. 7D with another semiconductor structure (e.g., first substrate layer 110, second substrate layer 130, FIG. 1).

Additionally, dimensions of the pad portions 771, 772, 771', 772' and interconnect portions 773, 773' may be selected based on a desired interconnect height and/or width (e.g., to provide for a desired spreading of solder and produce reliable structure). The pad portions 771, 772, 771', 772' of each one of the pad interconnects 770, 770' has a surface disposed over select portions of the second surface of the first substrate layer 710. Additionally, the interconnect portions 773, 773' of each one of the pad interconnects 770, 770' extend from the pad portions 771, 772, 771', 772' to the second surface of interconnect pads 752, 752' of the 3D IC structure 750. Interconnect portions 773, 773' also have a surface disposed over select edges of the openings (e.g., openings 760, 760', as shown in FIG. 7C) formed in the first substrate layer 710 and the adhesive layer 740.

Referring now to FIG. 7E, example semiconductor structures as may be provided as part of an example substrate joining layer (e.g., substrate joining layer 700, as will be discussed) are shown. In the example embodiment shown, a first one of the semiconductor structures (i.e., a first substrate joining layer portion), which is the same as the semiconductor structure shown in FIG. 7D, for example, includes first substrate layer 710, the plurality of interconnect pads (here, first, second, and third interconnect pads 720, 720', and 720"), the plurality of alignment marks (here, first and second alignment marks 730, 730'), adhesive layer 740, the three-dimensional (3D) IC structure 750, the plurality of openings (e.g., openings 760, 760', as shown in FIG. 7C), and the plurality of pad interconnects (here, first and second pad interconnects 770, 770'). The first surface of first substrate layer 710 corresponds to a first surface of the first semiconductor structure and the second surface of the adhesive layer 740 corresponds to a second opposing surface of the first semiconductor structure.

Additionally, a second one of the semiconductor structures (i.e., a second substrate joining layer portion), which is similar to the first semiconductor structure in the example embodiment shown, includes a second substrate layer 1710, a plurality of interconnect pads (here, first, second, and third interconnect pads 1720, 1720', and 1720"), a plurality of alignment marks (here, first and second alignment marks 1730, 1730'), an adhesive layer 1740, an IC structure 1750. In one embodiment, the IC structure 1750 is the same as or similar to 3D IC structure 750 (e.g., a 3D IC structure having a plurality of device layers). In another embodiment, the IC structure 1750 is different from the 3D IC structure 750, and is provided as a two-dimensional (2D) IC structure (e.g., a 2D IC structure having one device layer). The second semiconductor structure also includes a plurality of openings, similar to the openings in the first semiconductor structure, and a plurality of pad interconnects (here, first and second pad interconnects 1770, 1770').

In one embodiment, the process and materials (e.g., materials of first substrate layer 710 and insulating layer 780, as will be discussed) used to embed 3D IC structure 750 in the first semiconductor structure are substantially the same as the process and materials (e.g., materials of second substrate layer 1710 and insulating layer 780, as will be discussed) used to embed IC structure 1750 (e.g., a 2D IC structure) in the second semiconductor structure. In accordance with the concepts, systems, circuits, and techniques sought to be protected herein, such may be possible due the height variations between 3D structure 750 and IC structure 1750 being within materials thickness tolerance limits of the materials used to embed each of the 3D IC structure 750 and IC structure 1750. Additionally, in one embodiment, a bonding process occurring between substrate 1710, substrate 710 and insulating layer 780 (e.g., joining layer 780) uses pin lamination. Additionally, insulating layer 780 may include a plurality of dielectric sheets or materials (e.g., partially cured or uncured), each having same or different sizes. The dielectric sheets may be aligned with the pin to provide appropriate openings shaped to receive 3D structure 750 and IC structure 1750.

Second substrate layer 1710, similar to first substrate layer substrate 710, has first and second opposing surfaces and a plurality of electrical connections extending between the first and second surfaces. A first surface of second substrate layer 1710 corresponds to a first surface of the second semiconductor structure and a second surface of adhesive layer 1740 corresponds to a second opposing surface of the second semiconductor structure.

A third one of the semiconductor structures is an insulating layer 780. The insulating layer 780 (e.g., a free standing dielectric), which is provided from one or more dielectric materials (e.g., cured and/or partially cured dielectric materials) and/or electrically-insulating materials (e.g., bondable oxide, re-workable oxide, seamless oxide, etch-stoppable oxide), has first and second opposing surfaces. In one embodiment, insulating layer 780 is formed by disposing the dielectric materials and/or electrically-insulating materials over the first surface of the first semiconductor structure and exposing, developing, and/or curing the dielectric materials.

In the illustrated embodiment, the insulating layer 780 has a plurality of openings (here, first and second openings 782, 782') formed in select portions of the insulating layer 780. First and second openings 782, 782', which may be etched in the insulating layer 780, are shaped to receive IC structure 1750 and 3D IC structure 750, respectively. Insulating layer 780 (e.g., joining layer 780) may include a plurality of dielectric sheets or materials (e.g., partially cured or uncured), each having same or different sizes. The dielectric sheets may be aligned with the pin to provide appropriate openings shaped to receive 3D structure 750 and IC structure 1750 (e.g., after lamination). Additionally, insulating layer 780 can be filled and/or reinforced in some embodiments.

Referring now to FIG. 7F, an example substrate joining layer 700 as may be provided in an example method for fabricating a substrate joining layer in accordance with the concepts, systems, circuits and techniques sought to be protected herein is shown.

In the example method, the second surface of the first semiconductor structure is aligned with the second surface of the second semiconductor structure such that second surfaces of the first and second semiconductor structures are substantially parallel to each other and spaced apart from each other by a predetermined separation distance. Additionally, the second surface of the first semiconductor structure is aligned with the second surface of the second semiconductor structure such that insulating layer 780 is capable of being disposed between second surfaces of the first and second semiconductor structures.

Additionally, in the example method, the predetermined separation distance is decreased from a first distance to a second, lower distance such that the first surface of the insulating layer 780 is disposed over the second surface of the first semiconductor structure and the second surface of the insulating layer 780 is disposed over the second surface of the second semiconductor structure. The second distance may be about zero micrometers (μm) such that the first surfaces of the first and second semiconductor structures are physically in contact with the insulating layer 780 prior to being coupled to the insulating layer 780. Additionally, the second distance may be selected such that IC structure 1750 and 3D IC structure 750 are received by openings 782, 782' in insulating layer 780, respectively.

Further, in the example method, the first surface of the first semiconductor structure is coupled to the first surface of the insulating layer 780 and the first surface of the second semiconductor structure is coupled to the second surface of the insulating layer 780 to form the substrate joining layer 700. In some embodiments, an epoxy material is applied over one or more portions of the first surface of the first semiconductor structure, the second surface of the second semiconductor structure, the first surface of the insulating layer 780, and/or the second surface of the insulating layer 780 prior to coupling the first semiconductor structure, insulating layer 780, and the second semiconductor structure together. The epoxy material may, for example, help with aligning the first semiconductor structure, insulating layer 780, and the second semiconductor structure during coupling and provide for additional mechanical stability and reliability to the substrate joining layer 700 resulting from coupling of the first semiconductor structure, insulating layer 780, and the second semiconductor structure.

Alternatively, insulating layer 780 can be a free standing flowable dielectric sheet which has openings shaped to receive 3D structure 750 and IC structure 1750 prior to lamination. Lamination will fill gaps in the openings and create the semiconductor structure in FIG. 7F, for example.

Figure 8:
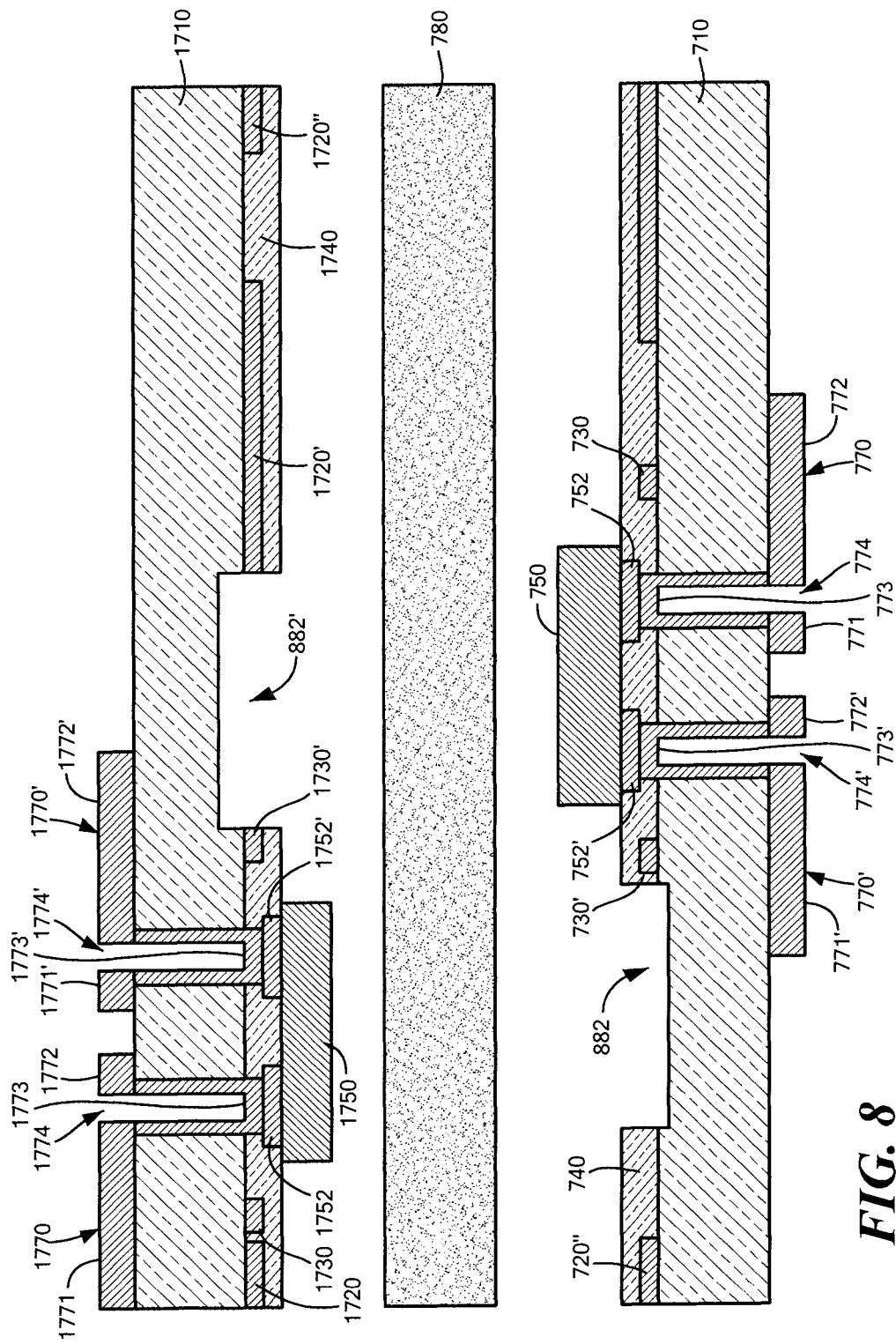
FIG. 8 is a block diagram of example semiconductor structures.

Referring now to FIG. 8, in which like elements of FIG. 7E are provided having like reference designations, example semiconductor structures as may be provided as part of an example substrate joining layer (e.g., substrate joining layer 800, as will be discussed) are shown. Here, however, instead of insulating layer 780 having a plurality of openings (first and second openings 782, 782', as shown in FIG. 7E) shaped to receive IC structure 1750 and 3D IC structure 750, respectively, the first and second semiconductor structures each have an opening shaped to receive a corresponding IC structure. In the illustrated embodiment, the first semiconductor structure has an opening 882 shaped to receive IC structure 1750 and the second semiconductor structure has an opening 882' shaped to receive 3D IC structure 750. Openings 882, 882' may be formed in the first and second semiconductor structures through mechanical or laser drilling which stop at a Cu surface to create the openings 882, 882', for example. Additionally, as illustrated, openings 882, 882' may extend through select portions of adhesive layers 740, 1740 and through select portions of first and second substrate layers 710, 1710, respectively, and act as a spacer. It is further possible to create the openings 882, 882' during substrate fabrication (e.g., as shown in FIG. 7) by laminating substrate 710 or substrate 1710 with one or more spacers.

Figure 8A:
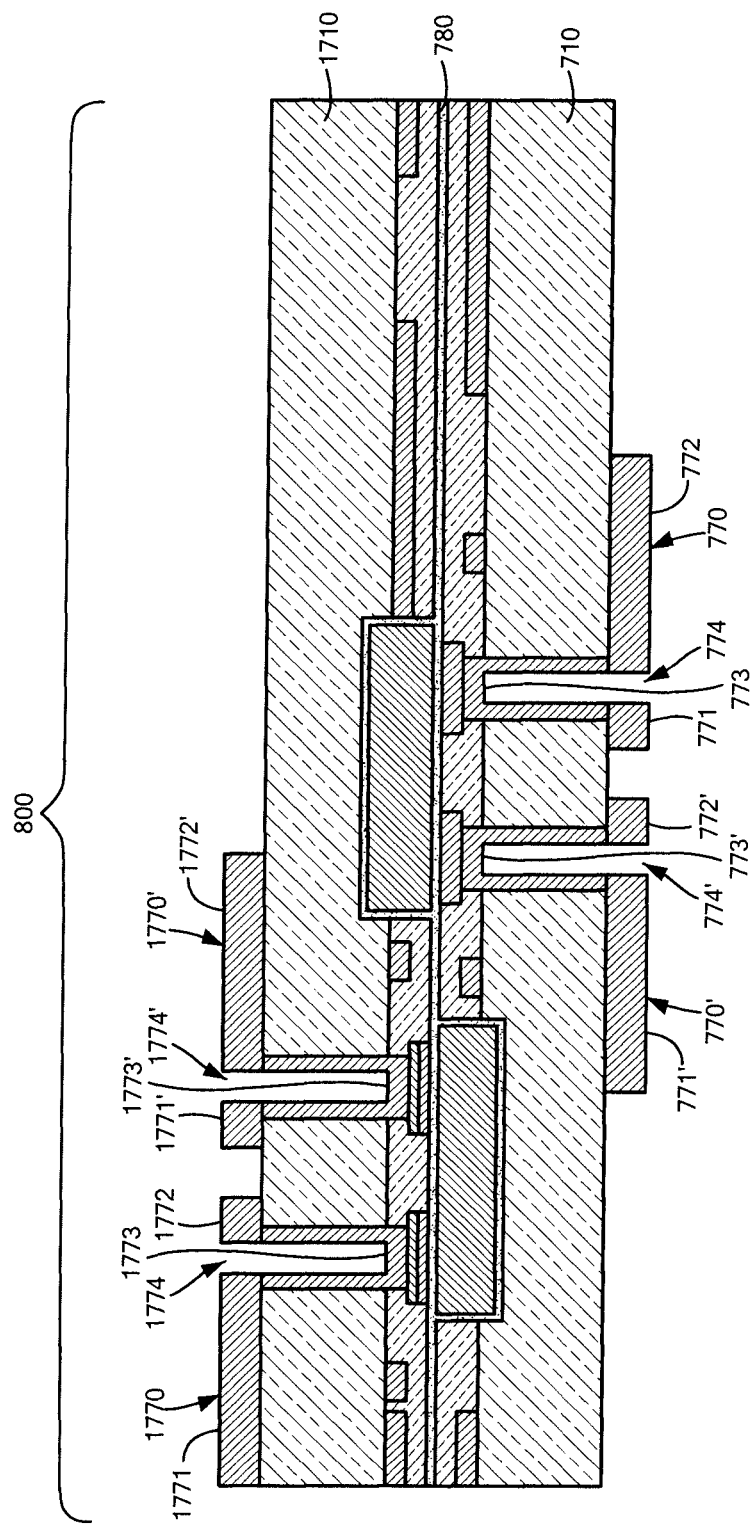
FIG. 8A is a block diagram of an example substrate joining layer including the semiconductor structures of FIG. 8, for example.

Referring now to FIG. 8A, an example substrate joining layer 800 as may be provided in an example method for fabricating a substrate joining layer in accordance with the concepts, systems, circuits and techniques sought to be protected herein is shown.

The example method for fabricating the substrate joining layer 800 is substantially the same as the method for fabricating substrate joining layer 700 shown in FIG. 7F. Here, however, insulating layer 780 is sandwiched (i.e., compressed) between the first semiconductor structure and the second semiconductor structure such that IC structure 1750 is received in opening 882 of the first semiconductor structure and 3D IC structure 750 is received in opening 882' of the second semiconductor structure. The applied temperature and pressure during the coupling process may, for example, melt or soften the insulating layer 780 such that the insulating layer 780 flows into empty spaces that may exist between the second surfaces of the first and second semiconductor structures. In one embodiment, the foregoing may provide for a more compact substrate joining layer.

Figure 9:
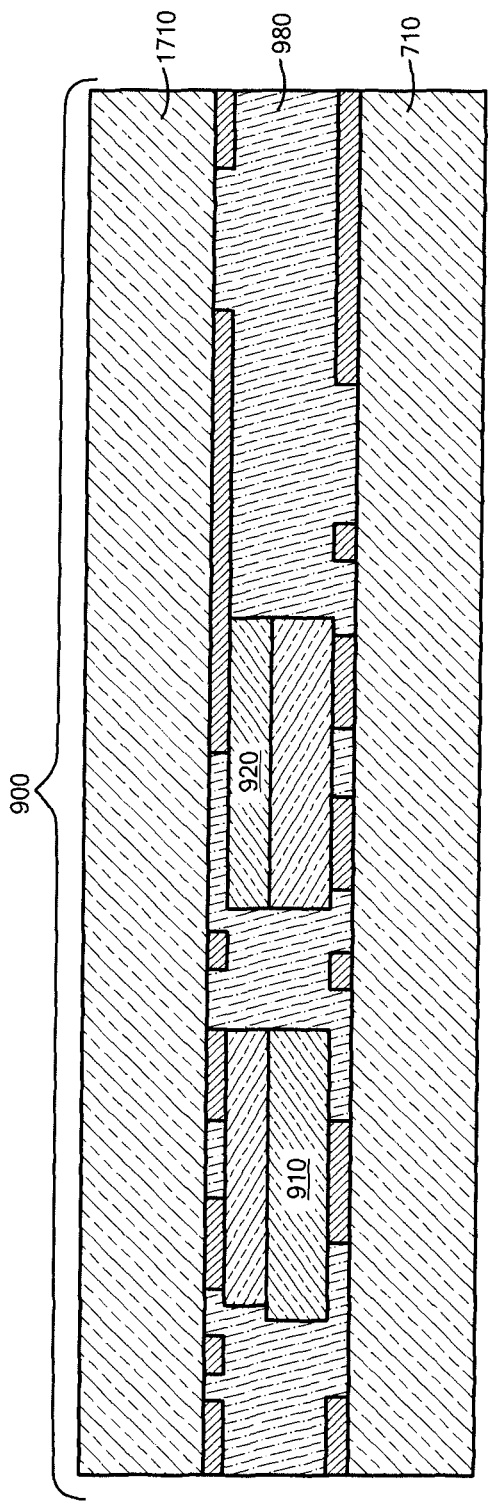
FIG. 9 is a block diagram of an example substrate joining layer.

Referring now to FIG. 9, an example substrate joining layer 900 similar to substrate joining layer 700 of FIG. 7E is shown. Here, however, the first and second semiconductor structures do not include an adhesive layer (i.e., adhesive layers 740, 1740). Substrate joining layer 900 may, for example, be formed in a substantially direct bonding process in which insulating layer 980 is a partially cured insulating layer with a plurality of openings (e.g., shaped to receive IC structures and dielectric spacers 2910, 2920, as will be discussed). Substrate layer 710 and insulating layer 980 may, for example, be bonded together with pin lamination. In one embodiment, substrate layer 710 is first disposed, insulating layer 980 (e.g., with one or more openings) is then disposed over substrate layer 710, a 2D IC structure and/or a 3D IC structure in placed in the opening(s), and cured and/or uncured materials or powder which are the same as or similar dielectric 980 are used to fill the opening(s).

Unlike substrate joining layer 700, substrate joining layer 2900 includes a plurality of dielectric spacers (here, first and second dielectric spacers 2910, 2920). In one embodiment, first and second dielectric spacers 2910, 2920 may prevent movement of 2D IC structures and/or 3D IC structures during lamination and/or bonding. Insulating layer 980 can be made with a cured dielectric in a first portion (e.g., a middle portion between the first and second opposing surfaces) and uncured or partially cured dielectric on second portion (e.g., a top portion) and third portion (e.g., bottom portion). The cured dielectric in the middle portion may, for example, prevent 2DIC/3DIC movement during lamination and/or bonding. First and second dielectric spacers 2910, 2920 may be provided from material(s) which are the same as or similar to isolating layer 710, and have first and second opposing surfaces.

In the illustrated embodiment, first dielectric spacer 2910 is disposed between the first surface of interconnect pad 720' of the first semiconductor structure and the first surface of IC structure 1750 of the second semiconductor structure. Additionally, second dielectric spacer 2920 is disposed between the first surface of 3D IC structure 750 of the first semiconductor structure and the first surface of interconnect pad 1720'. It should, of course, be appreciated that although first and second dielectric spacers 2910, 2920 are shown and described as disposed between particular surfaces above, first and second dielectric spacers 2910, 2920 may be disposed between any number of surfaces between the first semiconductor structure and the second semiconductor structure.

Figure 9A:
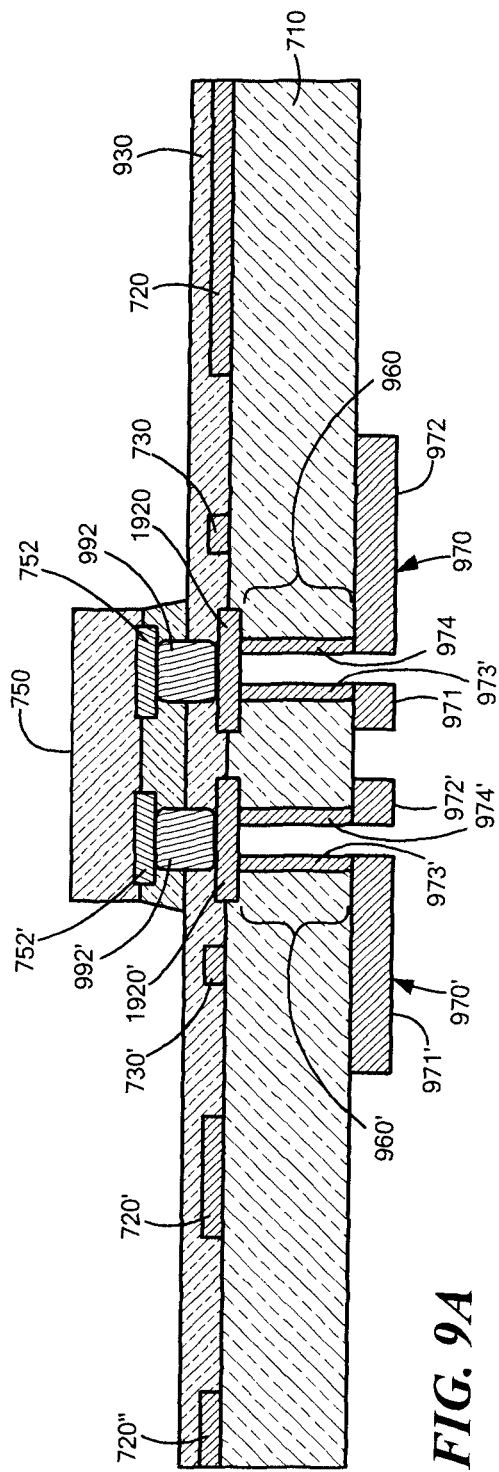
FIG. 9A is a block diagram of an example semiconductor structure as may be provided in an example method for fabricating a substrate joining layer in accordance with an embodiment.

Referring now to FIG. 9A, an example semiconductor structure which may be representative of a select portion (i.e., a first or a second portion) of a substrate joining layer is shown. The semiconductor structure includes first substrate layer 710, the plurality of interconnect pads (here, interconnect pads 720, 720', 720", 1920, and 1920'), the plurality of alignment marks (here, first and second alignment marks 730, 730').

The semiconductor structure also includes a solder mask 930. The solder mask 930, which may protect the plurality of electrical connections between the first and second surfaces of the first substrate layer 710 from oxidation and prevent solder shorting between first, second, and third interconnect pads 720, 720', and 720", for example, has a first surface disposed over the first surface of the first substrate layer 710, the second surfaces and the sides of the first, second, and third interconnect pads 720, 720', and 720", and the first and second alignment marks 730, 730'. The solder mask 930 also has a second opposing surface, the second surface extending a predetermined distance above the second surfaces and sides of first, second, and third interconnect pads 720, 720', and 720". In some embodiments, this predetermined distance is zero.

The semiconductor structure additionally includes a plurality of openings (here, first and second openings 960, 960') and a plurality of pad interconnects (here, first and second pad interconnects 970, 970'). First opening 960 extends between the second surface of the first substrate layer 710 and the first surface of interconnect pad 920. Additionally, second opening 960' extends between the second surface of the first substrate layer 710 and the first surface of the interconnect pad 920'.

First pad interconnect 970 includes a first pad portion 971, a second pad portion 972, a first interconnect portion 973, and a second interconnect portion 974. Additionally, second pad interconnect 970' includes a first pad portion 971', a second pad portion 972', a first interconnect portion 973', and a second interconnect portion 974'. The pad portions 971, 972, 971', 972' of each one of the pad interconnects 970, 970' has a surface disposed over select portions of the second surface of the first substrate layer 710. Additionally, the interconnect portions 973, 974, 973', 974' of each one of the pad interconnects 970, 970' extend from the pad portions 971, 972, 971', 972' to the second surface of select ones of the interconnect pads (here, interconnect pads 912, 912', respectively). Interconnect portions 973, 974, 973', 974' also have a surface disposed over select edges of openings 960, 960' formed in the first substrate layer 710.

The semiconductor structure further includes the 3D IC structure 750 and a plurality of conductive coupling structures (here, first and second conductive coupling structures 992, 992') disposed in openings formed between the second surface of solder mask 930 and the first surface of select ones of the interconnect pads (here, interconnect pads 920, 920'). First conductive coupling structure (e.g., solder, conductive paste) 992 electrically couples interconnect pad 920 to interconnect pad 752 of 3D IC structure 752. Additionally, second conductive coupling structure 992', which may be the same as or similar to first conductive coupling structure 992 in an embodiment, electrically couples interconnect pad 920' to interconnect pads 752' of 3D IC structure. Examples of suitable conductive paste for first and second conductive coupling structures 992, 992' may include isotropic conductive paste (ICP) and anisotropic conductive paste (ACP).

Additionally, in the illustrated embodiment, spaces existing between 3D IC structure 750 and the second surface of solder mask 930 are "underfilled" with one or more electrically-insulating materials 990, for example (e.g., to provide a stronger mechanical connection and a heat bridge between 3D IC structure 750 and solder mask 930).

Figure 10:
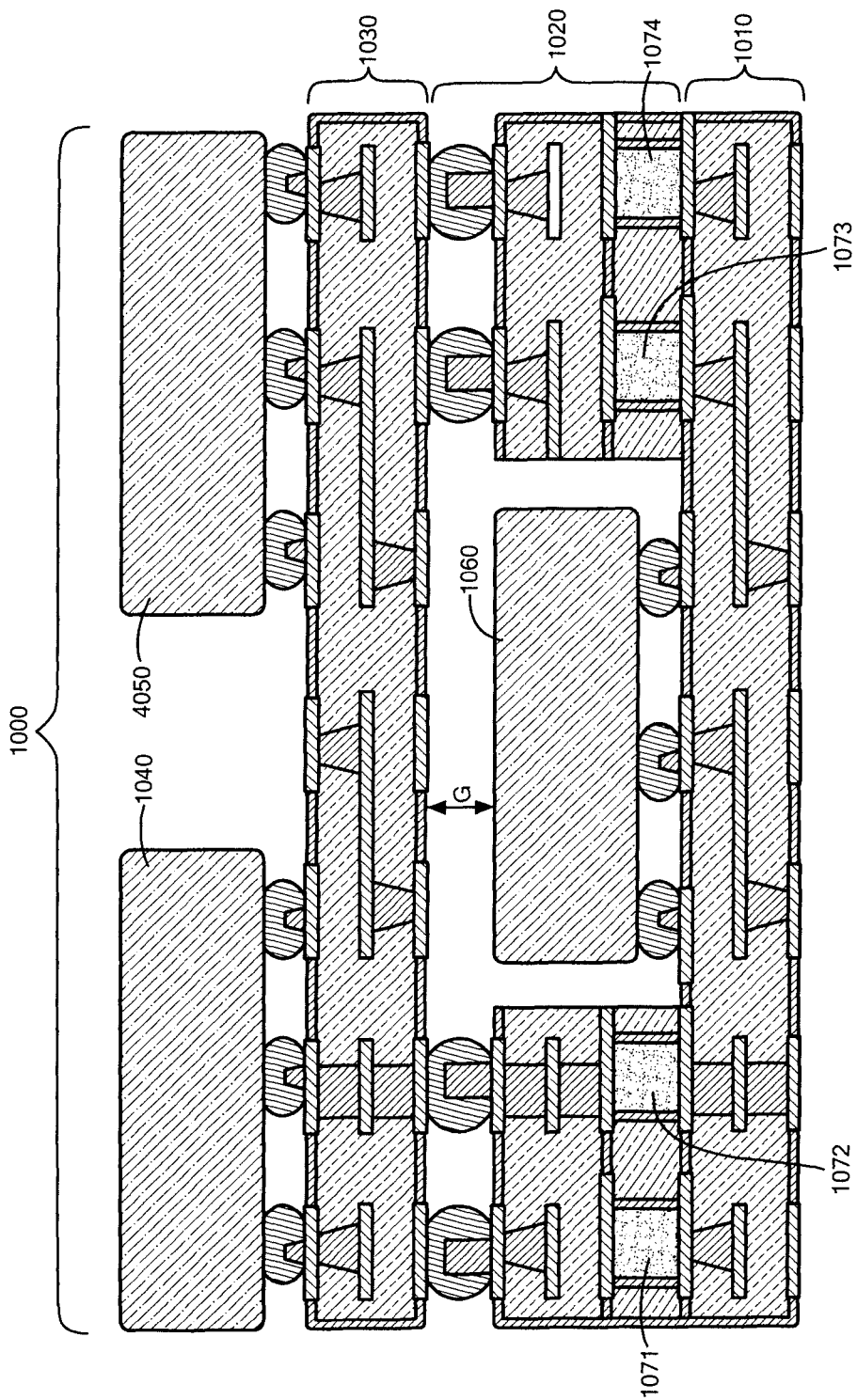
FIG. 10 is a block diagram of an example semiconductor structure.

Referring now to FIG. 10, an example semiconductor structure 1000 includes a first substrate layer 1010, a second substrate layer 1030, and a substrate joining layer 1020. Semiconductor structure 1000 also includes a first IC structure 1040 (e.g., a 2D IC structure, 3D IC structure) and a second IC structure 1050 (e.g., a 2D IC structure, 3D IC structure).

The substrate joining layer 1020 includes a plurality of conductive structures (here, conductive structures 1071, 1072, 1073, 1074) and an IC structure 1060 (e.g., 2D IC structure, 3D IC structure) disposed in a cavity formed between first and second surfaces of the substrate joining layer 1020. The cavity is designed such that it can accommodate the IC structure 1060 whether the IC structure 1060 is 2D IC structure (e.g., a single stack memory device having one device layer) or a 3D IC structure (e.g., a multi-stack memory device have a plurality of device layers), for example, providing for a universal substrate joining layer 1020. Conductive structures 1071, 1072, 1073, 1074 may each couple one or more portions of substrate joining layer 1030 together The IC structure 1060 has a first surface which is disposed over and proximate to a select surface (e.g., a second surface) of the first substrate layer 1010 and a second opposing surface which is proximate to a select surface (e.g., a first surface) of the second substrate layer 1030.

In the illustrated embodiment, a gap (G) (i.e., an interconnect gap) exists between the second surface of IC structure 1060 and the select surface of the second substrate layer 1030. In one embodiment, the gap G (e.g., as may be formed by the deformation of the interconnects of substrate joining layer 1020, which may have a predetermined distance between about 2.5 microns and about 100 microns, for example, is sufficient to compensate for differences in height of IC structures (e.g., IC structure 1060) that may be disposed in the cavity. A 2D IC structure may have a height of about 150 microns and a 3D IC structure may have a height of about 160 microns, for example.

Semiconductor device 1000 may, for example, be formed in a single semiconductor package or in a package-on-package (PoP) structure. In an example embodiment where semiconductor device 1000 is formed in a PoP structure, the second substrate layer 1030, the first IC structure 1040, and the second IC structure 1050 may correspond to a first (or "top") package of the PoP configuration, and the first substrate layer 1010 and the substrate joining layer 1020 may correspond to a second (or "bottom") package of the PoP configuration. In embodiments where the IC structure 1060 is provided as a 2D IC structure, for example, the IC structure 1060 may be replaced with a 3D IC structure without changing thickness of the PoP structure in accordance with the concepts, systems, circuits, and techniques sought to be protected herein.

While the above figures illustrate various semiconductor structures including a certain number of dies, interconnects, substrates, IC devices, components and the like, the concepts, systems, circuits and techniques disclosed herein may be applied to semiconductor structures including any number of dies, interconnects, substrates, IC devices, components and the like.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate semiconductor structures including at least one integrated circuit structure.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

The invention claimed is:

1. A semiconductor structure, comprising:
at least two substrate layers, each of the at least two substrate layers having first and second opposing surfaces and a plurality of electrical connections extending between the first and second surfaces, and each of the at least two substrate layers including:
one or more interconnect pads having first and second opposing surfaces and one or more sides, wherein the first surface of at least a first select one of the interconnect pads of a first one of the at least two substrate layers is disposed over or beneath select portions of the second surface of the first one of the substrate layers and is electrically coupled to select ones of the electrical connections in the first one of the substrate layers, and the first surface of at least a first select one of the interconnect pads of a second one of the at least two substrate layers is disposed over or beneath select portions of the first surface of the second one of the substrate layers and is electrically coupled to select ones of the electrical connections in the second one of the substrate layers; and
a substrate joining layer disposed between and coupled to the second surface of the first one of the substrate layers and the first surface of the second one of the substrate layers, said substrate joining layer having first and second opposing surfaces, the first and second opposing surfaces cured to form a plurality of electrical connections extending between select portions of the first and second surfaces, and including:
at least one integrated circuit (IC) structure disposed between the first and second surfaces of said substrate joining layer in a manner such that a first two-dimensional (2D) IC structure of the at least one IC structure having a first thickness, and a second three-dimensional (3D) IC structure of the at least one IC structure having a second thickness that is substantially greater than the first thickness, are capable of being disposed between the first and second surfaces of said substrate joining layer without substantially changing a thickness of said substrate joining layer as long as the second thickness of the second 3D IC structure is within a tolerance limit of the first thickness of the first 2D IC structure, the thickness of said substrate joining layer corresponding to a distance between the first and second surfaces of said substrate joining layer, the at least one IC structure having first and second opposing surfaces and including:
one or more interconnect pads having first and second opposing surfaces and one or more sides, wherein the first surface of at least a first select one of the interconnect pads is disposed over or beneath select portions of the first surface of the at least one IC structure and is electrically coupled to select ones of the electrical connections in said substrate joining layer.

2. The semiconductor structure of claim 1 wherein the first surface of said substrate joining layer is electrically coupled to the second surface of the first select one of the interconnect pads of the first one of the substrate layers, and the second surface of said substrate joining layer is electrically coupled to the second surface of the second select one of the interconnect pads of the second one of the substrate layers to form one or more electrical connections between the first one of the substrate layers and the second one of the substrate layers.

3. The semiconductor structure of claim 1 further comprising:
a 2D IC structure disposed over and coupled to the first surface of said first substrate layer or the second surface of said second substrate layer, the 2D IC structure having first and second opposing surfaces and one or more interconnect pads, the interconnect pads having first and second opposing surfaces and one or more sides, wherein the first surface of at least a first select one of the interconnect pads of the 2D IC structure is disposed over or beneath select portions of the first surface of the 2D IC structure; and
a 3D IC structure disposed over and coupled to the first surface of said first substrate layer or the second surface of said second substrate layer, the 3D IC structure having first and second opposing surfaces and one or more interconnect pads, the interconnect pads having first and second opposing surfaces and one or more sides, wherein the first surface of at least a first select one of the interconnect pads of the 3D IC structure is disposed over or beneath select portions of the first surface of the 3D IC structure.

4. The semiconductor structure of claim 3 further comprising:
one or more fusible coupling structures disposed between and electrically coupled to the second surface of at least the first select one of the interconnect pads of the 2D IC structure and the second surface of a second select one of the interconnect pads of the second one of the substrate layers, wherein the first surface of the second select one of the interconnect pads is disposed over or beneath select portions of the second surface of the second one of the substrate layers and is electrically coupled to second select ones of the electrical connections in the second one of the substrate layers; and
one or more fusible coupling structures disposed between and electrically coupled to the second surface of at least the first select one of the interconnect pads of the 3D IC structure and the second surface of a third select one of the interconnect pads of the second one of the substrate layers, wherein the first surface of the third select one of the interconnect pads is disposed over or beneath select portions of the second surface of the second one of the substrate layers and is electrically coupled to third select ones of the electrical connections in the second one of the substrate layers.

5. The semiconductor structure of claim 3 further comprising:
a heat dissipation structure having first and second opposing surfaces, wherein a first surface of the heat dissipation structure is disposed over and coupled to at least one of the second surface of the 2D IC structure and the second surface of the 3D IC structure.

6. The semiconductor device of claim 5 further comprising:
a thermal interface structure disposed between the first surface of the heat dissipation structure and the second surface of the 2D IC structure and/or the first surface of the heat dissipation structure and the second surface of the 3D IC structure.

7. The semiconductor structure of claim 5 wherein the first surface of the heat dissipation structure is further disposed over and coupled to the second surface of at least a fourth select one of the interconnect pads of the second one of the substrate layers, wherein the first surface of the fourth select one of the interconnect pads is disposed over or beneath select portions of the second surface of the second one of the substrate layers and is electrically coupled to fourth select ones of the electrical connections in the second one of the substrate layers.

8. The semiconductor structure of claim 1 further comprising:
one or more fusible coupling structures disposed between and coupled to the second surface of the first one of the substrate layers and to the first surface of the second one of the substrate layers to form an interconnect for electrically and mechanically coupling the first one of the substrate layers to the second one of the substrate layers.

9. The semiconductor structure of claim 8 wherein the fusible coupling structures are provided as at least one of a solder ball and a self-aligned contact pad.

10. The semiconductor structure of claim 1 wherein at least one of the first one of the substrate layers and the second one of the substrate layers is a multi-layer substrate.

11. The semiconductor structure of claim 1 wherein the semiconductor structure is integrated into a communications device.

12. A semiconductor structure, comprising:
at least two substrate layers, each of the at least two substrate layers having first and second opposing surfaces and a plurality of electrical connections extending between the first and second surfaces, and each of the at least two substrate layers including:
one or more interconnect pads having first and second opposing surfaces and one or more sides, wherein the first surface of at least a first select one of the interconnect pads of a first one of the at least two substrate layers is disposed over or beneath select portions of the second surface of the first one of the substrate layers and is electrically coupled to select ones of the electrical connections in the first one of the substrate layers, and the first surface of at least a first select one of the interconnect pads of a second one of the at least two substrate layers is disposed over or beneath select portions of the first surface of the second one of the substrate layers and is electrically coupled to select ones of the electrical connections in the second one of the substrate layers; and
a substrate joining layer disposed between and coupled to the second surface of the first one of the substrate layers and the first surface of the second one of the substrate layers, said substrate joining layer having first and second opposing surfaces and a plurality of electrical connections extending between select portions of the first and second surfaces, and including:
at least one integrated circuit (IC) structure disposed between the first and second surfaces of said substrate joining layer in a manner such that a first IC structure of the at least one IC structure having a first thickness, and a second IC structure of the at least one IC structure having a second thickness that is substantially greater than the first thickness, are capable of being disposed between the first and second surfaces of said substrate joining layer without substantially changing a thickness of said substrate joining layer as long as the second thickness of the second IC structure is within a tolerance limit of the first thickness of the first IC structure, the thickness of said substrate joining layer corresponding to a distance between the first and second surfaces of said substrate joining layer, the at least one IC structure having first and second opposing surfaces and including:
one or more interconnect pads having first and second opposing surfaces and one or more sides, wherein the first surface of at least a first select one of the interconnect pads is disposed over or beneath select portions of the first surface of the at least one IC structure and is electrically coupled to select ones of the electrical connections in said substrate joining layer;
wherein the at least one IC structure of said substrate joining layer includes a two-dimensional (2D) IC structure and a three-dimensional (3D) IC structure, and the 2D IC structure corresponds to a first IC structure of the at least one IC structure and the 3D IC structure corresponds to the second IC structure of the at least one IC structure.

13. A semiconductor structure, comprising:
at least two substrate layers, each of the at least two substrate layers having first and second opposing surfaces and a plurality of electrical connections extending between the first and second surfaces, and each of the at least two substrate layers including:
one or more interconnect pads having first and second opposing surfaces and one or more sides, wherein the first surface of at least a first select one of the interconnect pads of a first one of the at least two substrate layers is disposed over or beneath select portions of the second surface of the first one of the substrate layers and is electrically coupled to select ones of the electrical connections in the first one of the substrate layers, and the first surface of at least a first select one of the interconnect pads of a second one of the at least two substrate layers is disposed over or beneath select portions of the first surface of the second one of the substrate layers and is electrically coupled to select ones of the electrical connections in the second one of the substrate layers; and
a substrate joining layer disposed between and coupled to the second surface of the first one of the substrate layers and the first surface of the second one of the substrate layers, said substrate joining layer having first and second opposing surfaces and a plurality of electrical connections extending between select portions of the first and second surfaces, and including:
at least one integrated circuit (IC) structure disposed between the first and second surfaces of said substrate joining layer, the at least one IC structure having first and second opposing surfaces and including:
one or more interconnect pads having first and second opposing surfaces and one or more sides, wherein the first surface of at least a first select one of the interconnect pads is disposed over or beneath select portions of the first surface of the at least one IC structure and is electrically coupled to select ones of the electrical connections in said substrate joining layer, wherein the at least one IC structure includes a two-dimensional (2D) IC structure and a three-dimensional (3D) IC structure;
a first substrate joining layer portion having first and second opposing surfaces and a first plurality of electrical connections extending between select portions of the first and second surfaces, wherein the first surface of the first substrate joining layer portion corresponds to the first surface of said substrate joining layer, and the 3D IC structure is disposed between the first and second surfaces of the first substrate joining layer portion, the 3D IC structure including at least a first select interconnect pad disposed over or beneath select portions of the first surface of the 3D IC structure, the first select interconnect pad electrically coupled to first select ones of the first plurality of electrical connections in the first substrate joining layer portion;

a second substrate joining layer portion having first and second opposing surfaces and a second plurality of electrical connections extending between select portions of the first and second surfaces, wherein the first surface of the second substrate joining layer portion corresponds to the second surface of said substrate joining layer, and the 2D IC structure is disposed between the first and second surfaces of the second substrate joining layer portion, the 2D IC structure including at least a first select interconnect pad disposed over or beneath select portions of the first surface of the 2D IC structure, the first select interconnect pad electrically coupled to first select ones of the second plurality of electrical connections in the second substrate joining layer portion; and an insulating layer having first and second opposing surfaces, wherein the first surface of the insulating layer is coupled to the second surface of the first substrate joining layer portion, and the second surface of the insulating layer is coupled to the second surface of the second substrate joining layer portion.

14. The semiconductor structure of claim 13 wherein said substrate joining layer further comprises:

openings formed in select portions of the insulating layer, the openings shaped to receive the 3D IC structure and the 2D IC structure.

15. The semiconductor structure of claim 13 wherein the first substrate joining layer portion further comprises:

a first substrate layer having first and second opposing surfaces and a plurality of electrical connections extending between the first and second surfaces, the first surface of the first substrate layer corresponding to the first surface of the first substrate joining layer portion and the plurality of electrical connections in the first substrate layer corresponding to the first plurality of electrical connections in the first substrate joining layer portion;

one or more interconnect pads having first and second opposing surfaces and one or more sides, wherein the first surface of each one of the interconnect pads is disposed over or beneath select portions of the second surface of the first substrate layer and is electrically coupled to select ones of the electrical connections in the first substrate layer;

one or more alignment marks disposed over or beneath the second surface of the first substrate layer; and an adhesive layer having first and second opposing surfaces, wherein the first surface of the adhesive layer is disposed over at least the second surface of the first substrate layer and the second surfaces and one or more sides of the interconnect pads, and the first surface of the 3D IC structure is disposed over or beneath select portions of the second surface of the adhesive layer and is aligned relative to at least one of the alignment marks; and one or more pad interconnects having at least one pad portion and at least one interconnect portion, the pad interconnects electrically coupled to at least the first select interconnect pad of the 3D IC structure, wherein the pad portion of each one of the pad interconnects has a surface disposed over select portions of the first surface of the first substrate layer and the interconnect portion of each one of the pad interconnects extends from the pad portion to the second surface of at least the first select interconnect pad of the 3D IC structure.

16. The semiconductor structure of claim 15 wherein the first substrate joining layer portion further comprises:

a second substrate layer having first and second opposing surfaces and a plurality of electrical connections extending between the first and second surfaces, the first surface of the second substrate layer corresponding to the first surface of the second substrate joining layer portion and the plurality of electrical connections in the second substrate layer corresponding to the second plurality of electrical connections in the second substrate joining layer portion;

one or more interconnect pads having first and second opposing surfaces and one or more sides, wherein the first surface of each one of the interconnect pads is disposed over or beneath select portions of the second surface of the second substrate layer and is electrically coupled to select ones of the electrical connections in the second substrate layer;

one or more alignment marks disposed over or beneath the second surface of the second substrate layer; and an adhesive layer having first and second opposing surfaces, wherein the first surface of the adhesive layer is disposed over at least the second surface of the second substrate layer and the second surfaces and one or more sides of the interconnect pads, and the first surface of the 2D IC structure is disposed over or beneath select portions of the second surface of the adhesive layer and is aligned relative to at least one of the alignment marks; and one or more pad interconnects having at least one pad portion and at least one interconnect portion, the pad interconnects electrically coupled to at least the first select interconnect pad of the 2D IC structure, wherein the pad portion of each one of the pad interconnects has a surface disposed over select portions of the first surface of the second substrate layer and the interconnect portion of each one of the pad interconnects extends from the pad portion to the second surface of at least the first select interconnect pad of the 2D IC structure.

* * * * *